(12) United States Patent
Ikenaga et al.

(10) Patent No.: US 10,233,546 B2
(45) Date of Patent: Mar. 19, 2019

(54) METAL PLATE, METHOD OF MANUFACTURING METAL PLATE, AND METHOD OF MANUFACTURING MASK BY USE OF METAL PLATE

(71) Applicant: Dai Nippon Printing Co., Ltd., Tokyo (JP)

(72) Inventors: Chikao Ikenaga, Tokyo (JP); Isao Miyatani, Tokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 169 days.

(21) Appl. No.: 14/917,089

(22) PCT Filed: Sep. 12, 2014

(86) PCT No.: PCT/JP2014/074255
§ 371 (c)(1),
(2) Date: Mar. 7, 2016

(87) PCT Pub. No.: WO2015/037709
PCT Pub. Date: Mar. 19, 2015

(65) Prior Publication Data
US 2016/0208392 A1    Jul. 21, 2016

(30) Foreign Application Priority Data
Sep. 13, 2013    (JP) .................................. 2013-190881

(51) Int. Cl.
*C23F 1/00*    (2006.01)
*C23C 14/24*   (2006.01)
(Continued)

(52) U.S. Cl.
CPC ............. *C23F 1/00* (2013.01); *C23C 14/021* (2013.01); *C23C 14/042* (2013.01); *C23C 14/12* (2013.01); *C23C 14/24* (2013.01); *C23F 1/02* (2013.01)

(58) Field of Classification Search
None
See application file for complete search history.

(56) References Cited

U.S. PATENT DOCUMENTS 1,517,633 A * 12/1924 Junkers .................. B21D 13/04
                                                       428/185
4,494,205 A    1/1985 Dairiki et al.
(Continued)

FOREIGN PATENT DOCUMENTS

| CN | 1295334 A | 5/2001 |
| CN | 1316016 A | 10/2001 |

(Continued)

OTHER PUBLICATIONS

International Preliminary Report on Patentability (Application No. PCT/JP2014/074255) dated Mar. 24, 2016.
(Continued)

*Primary Examiner* — Adam Krupicka
(74) *Attorney, Agent, or Firm* — Burr & Brown, PLLC

(57) ABSTRACT

The object of the present invention is to provide a metal plate having an excellent transportability. A maximum value of a steepness degree at a central area in a width direction of the metal plate is not more than 0.4%. In addition, the maximum value of the steepness degree at the central area is not more than a steepness degree at one end side area, and is not more than a steepness degree at the other end side area. Further, a difference between the maximum value of the
(Continued)

Position in width direction steepness degree at the one end side area and the maximum value of the steepness degree at the other end side area is not more than 0.4%.

19 Claims, 16 Drawing Sheets

(51) Int. Cl.
*C23C 14/04* (2006.01)
*C23C 14/12* (2006.01)
*C23C 14/02* (2006.01)
*C23F 1/02* (2006.01)

(56) References Cited

U.S. PATENT DOCUMENTS

| | | | |
|---|---|---|---|
| 4,596,943 A | 6/1986 | Akiyoshi et al. | |
| 5,200,025 A | 4/1993 | Toei et al. | |
| 6,316,869 B1 | 11/2001 | Kim et al. | |
| 6,423,160 B1 | 7/2002 | Arimoto et al. | |
| 6,559,583 B1 | 5/2003 | Kanayama et al. | |
| 6,875,542 B2 | 4/2005 | Yotsuya | |
| 7,648,729 B2 | 1/2010 | Nakadate | |
| 8,313,806 B2 | 11/2012 | Matsuura | |
| 8,545,631 B2 | 10/2013 | Kim et al. | |
| 9,828,665 B2 | 11/2017 | Ikenaga et al. | |
| 2001/0047839 A1 | 12/2001 | Hatano et al. | |
| 2002/0117241 A1 | 8/2002 | Etoh | |
| 2003/0228417 A1 | 12/2003 | Nishikawa et al. | |
| 2004/0135498 A1 | 7/2004 | Takanosu et al. | |
| 2004/0142202 A1 | 7/2004 | Kinoshita et al. | |
| 2007/0051439 A1 | 3/2007 | Van Der Winden | |
| 2007/0072337 A1 | 3/2007 | Matsuzaki et al. | |
| 2011/0131792 A1 | 6/2011 | Kwak et al. | |
| 2011/0220493 A1 | 9/2011 | Aratake | |
| 2012/0060756 A1 | 3/2012 | Ookawara et al. | |
| 2015/0037928 A1 | 2/2015 | Hirobe et al. | |
| 2016/0208392 A1 | 7/2016 | Ikenaga et al. | |
| 2016/0237546 A1 | 8/2016 | Ikenaga et al. | |
| 2016/0293472 A1 | 10/2016 | Chang et al. | |
| 2017/0141315 A1 | 5/2017 | Ikenaga | |

FOREIGN PATENT DOCUMENTS

| | | |
|---|---|---|
| CN | 103205701 A | 7/2003 |
| CN | 1514675 A | 7/2004 |
| CN | 1526850 A | 9/2004 |
| CN | 1754968 A | 4/2006 |
| CN | 101210307 A | 7/2008 |
| CN | 202786401 U | 3/2013 |
| CN | 103031578 A | 4/2013 |
| EP | 0 055 587 A2 | 7/1982 |
| JP | S56-41331 | 4/1981 |
| JP | H05-009755 A1 | 1/1993 |
| JP | 05-208206 A1 | 8/1993 |
| JP | H06-238384 A1 | 8/1994 |
| JP | 07-227620 A1 | 8/1995 |
| JP | H08-67914 | 3/1996 |
| JP | 09-087741 A1 | 3/1997 |
| JP | 09-095740 A1 | 4/1997 |
| JP | 09-324285 A1 | 12/1997 |
| JP | H10-053858 A1 | 2/1998 |
| JP | H10-060525 A1 | 3/1998 |
| JP | 10-214562 A1 | 8/1998 |
| JP | 11-057812 A1 | 3/1999 |
| JP | H11-229040 | 8/1999 |
| JP | 2000-256800 A1 | 9/2000 |
| JP | 2000-345242 A1 | 12/2000 |
| JP | 2001-226718 A1 | 8/2001 |
| JP | 2001-234385 A1 | 8/2001 |
| JP | 2001-247939 A1 | 9/2001 |
| JP | 2001-325881 A1 | 11/2001 |
| JP | 2002-237254 A | 8/2002 |
| JP | 2003-100460 A1 | 4/2003 |
| JP | 2003-272838 A | 9/2003 |
| JP | 2003-286527 A1 | 10/2003 |
| JP | 2004-039319 A1 | 2/2004 |
| JP | 2004-063375 A1 | 2/2004 |
| JP | 2004-185890 A1 | 7/2004 |
| JP | 2004-362908 A1 | 12/2004 |
| JP | 2005-154879 | 6/2005 |
| JP | 2005-183153 A | 7/2005 |
| JP | 2005-340138 A1 | 12/2005 |
| JP | 2006-247721 A1 | 9/2006 |
| JP | 2007-095324 A1 | 4/2007 |
| JP | 2008-41553 A | 2/2008 |
| JP | 2008-255449 A1 | 10/2008 |
| JP | 2009-019243 A1 | 1/2009 |
| JP | 2009-074160 A1 | 4/2009 |
| JP | 2009-120919 A1 | 6/2009 |
| JP | 2010-216012 A1 | 9/2010 |
| JP | 2011-190509 A1 | 9/2011 |
| JP | 2012-111195 A1 | 6/2012 |
| JP | 2013-016491 A1 | 1/2013 |
| JP | 5382257 B2 | 1/2014 |
| JP | 5382259 B1 | 1/2014 |
| JP | 5455099 B1 | 3/2014 |
| JP | 2014-65928 A | 4/2014 |
| JP | 5459632 B1 | 4/2014 |
| JP | 5516816 B1 | 6/2014 |
| JP | 5626491 B1 | 11/2014 |
| JP | 5641462 B1 | 12/2014 |
| JP | 2015-017308 A1 | 1/2015 |
| KR | 10-2005-0100701 A | 10/2005 |
| KR | 10-2006-0021343 | 3/2006 |
| KR | 10-0796617 B1 | 1/2008 |
| TW | 201435111 A | 9/2014 |
| WO | 2014/038510 A1 | 3/2014 |

OTHER PUBLICATIONS

Japanese Office Action (Application No. 2013-190881) dated Nov. 1, 2013 (with English translation).
"Method of Measuring Radius of Curvature of Arc," *Curriculum of Investigation into Dynamics of Traffic Accidents*, Oct. 31, 2002, pp. 378-379 (with English translation).
Hiromu Suzuki, "Shape Control Technology in the Rolling Metal Strip," *Journal of the Japan Society of Mechanical Engineers*, Jun. 1984, vol. 87, Issue 787, pp. 13-18 (with English translation).
Japanese Office Action (Application No. 2016-021255) dated Apr. 22, 2016 (with English translation).
Japanese Office Action (Application No. 2016-021255) dated Aug. 19, 2016 (with English translation).
Japanese Office Action (Application No. 2013-215061) dated Dec. 10, 2013 (with English translation).
Chinese Office Action (Application No. 201480056293.3) dated Dec. 21, 2016 (with English translation).
Chinese Office Action (Application No. 201480003438.3) dated Oct. 11, 2016 (with English translation).
Chinese Office Action (Application No. 201480003445.3) dated Oct. 8, 2016 (with English translation).
Korean Office Action (Application No. 10-2015-7009819) dated Oct. 17, 2016 (with English translation).
Korean Office Action (Application No. 10-2015-7009821) dated Oct. 17, 2016 (with English translation).
Korean Office Action (Application No. 10-2016-7009298) dated Oct. 17, 2016 (with English translation).
Korean Office Action (Application No. 10-2016-7031159) dated Nov. 14, 2017 (with English translation).
English translation of International Preliminary Report on Patentability (Application No. PCT/JP2014/050345) dated Jul. 23, 2015.
English translation of International Preliminary Report on Patentability (Application No. PCT/JP2014/050346) dated Jul. 23, 2015.
English translation of International Preliminary Report on Patentability (Application No. PCT/JP2014/075168) dated Apr. 28, 2016.
English translation of International Preliminary Report on Patentability (Application No. PCT/JP2015/062782) dated Nov. 24, 2016.
English translation of International Preliminary Report on Patentability (Application No. PCT/JP2016/053580) dated Aug. 24, 2017.

(56) References Cited

OTHER PUBLICATIONS

Chinese Office Action (Application No. 201480048190.2) dated Feb. 9, 2017 (with English translation).
Korean Office Action (Application No. 10-2016-7006016) dated Nov. 25, 2016 (with English translation).
International Search Report and Written Opinion (Application No. PCT/JP2014/074255) dated Dec. 2, 2014.
"Selection of Optimum Process of Manufacturing a Nickel Foil by Electrolysis" (Beijing Colored Metal Research Paper), Dec. 31, 1993, pp. 23-26.
Chinese Office Action (Application No. 201680001423.2) dated May 2, 2018 (with English translation).
Chinese Office Action (Application No. 201580024875.8) dated May 24, 2018 (with English translation).
H. Tohma, "Actual Background Treatment," *Journal of Surface Analysis*, 2001, vol. 8, pp. 49-54.
Japanese Office Action (Application No. 2016-199397) dated Jun. 29, 2018 (with English translation).
Extended European Search Report (Application No. 16749177.8) dated Jul. 19, 2018.
Taiwanese Office Action (Application No. 105104155) dated Apr. 20, 2018.
Extended European Search Report (Application No. 15792096.8) dated May 4, 2018.

\* cited by examiner

| | STEEPNESS DEGREE [%] | | | JUDGMENT RESULT |
|---|---|---|---|---|
| | MAXIMUM VALUE AT ONE END SIDE AREA | MAXIMUM VALUE AT CENTRAL AREA | MAXIMUM VALUE AT OTHER END SIDE AREA | |
| FIRST SAMPLE | 0.1 | 0.2 | 0.3 | UNACCEPTABLE |
| SECOND SAMPLE | 0.1 | 0.2 | 0.5 | UNACCEPTABLE |
| THIRD SAMPLE | 0.1 | 0.2 | 0.8 | UNACCEPTABLE |
| FOURTH SAMPLE | 0.2 | 0.2 | 0.3 | ACCEPTABLE |
| FIFTH SAMPLE | 0.2 | 0.2 | 0.6 | ACCEPTABLE |
| SIXTH SAMPLE | 0.2 | 0.2 | 0.7 | UNACCEPTABLE |
| SEVENTH SAMPLE | 0.3 | 0.2 | 0.1 | UNACCEPTABLE |
| EIGHTH SAMPLE | 0.3 | 0.2 | 0.2 | ACCEPTABLE |
| NINTH SAMPLE | 0.3 | 0.2 | 0.4 | ACCEPTABLE |
| TENTH SAMPLE | 0.3 | 0.2 | 1.0 | UNACCEPTABLE |
| ELEVENTH SAMPLE | 0.2 | 0.3 | 0.5 | UNACCEPTABLE |
| TWELFTH SAMPLE | 0.3 | 0.3 | 0.6 | ACCEPTABLE |
| THIRTEENTH SAMPLE | 0.4 | 0.3 | 0.7 | ACCEPTABLE |
| FOURTEENTH SAMPLE | 0.3 | 0.4 | 0.3 | UNACCEPTABLE |
| FIFTEENTH SAMPLE | 0.4 | 0.4 | 0.6 | ACCEPTABLE |
| SIXTEENTH SAMPLE | 0.5 | 0.4 | 0.7 | ACCEPTABLE |
| SEVENTEENTH SAMPLE | 0.4 | 0.5 | 0.6 | UNACCEPTABLE |
| EIGHTEENTH SAMPLE | 0.5 | 0.5 | 0.7 | UNACCEPTABLE |
| NINETEENTH SAMPLE | 0.6 | 0.5 | 0.8 | UNACCEPTABLE |
| TWENTIETH SAMPLE | 0.7 | 0.6 | 1.0 | UNACCEPTABLE |

FIG.24

| | BUCKLING BEND | | SLIPPAGE | | PLATE INCISION | JUDGEMENT RESULT |
|---|---|---|---|---|---|---|
| | BEFORE ETCHING | AFTER ETCHING | BEFORE ETCHING | AFTER ETCHING | | |
| FIRST WINDING BODY | ACCEPTABLE | ACCEPTABLE | UN-ACCEPTABLE | UN-ACCEPTABLE | ACCEPTABLE | UN-ACCEPTABLE |
| SECOND WINDING BODY | ACCEPTABLE | ACCEPTABLE | UN-ACCEPTABLE | UN-ACCEPTABLE | ACCEPTABLE | UN-ACCEPTABLE |
| THIRD WINDING BODY | ACCEPTABLE | ACCEPTABLE | UN-ACCEPTABLE | UN-ACCEPTABLE | ACCEPTABLE | UN-ACCEPTABLE |
| FOURTH WINDING BODY | ACCEPTABLE | ACCEPTABLE | ACCEPTABLE | ACCEPTABLE | ACCEPTABLE | ACCEPTABLE |
| FIFTH WINDING BODY | ACCEPTABLE | ACCEPTABLE | ACCEPTABLE | ACCEPTABLE | ACCEPTABLE | ACCEPTABLE |
| SIXTH WINDING BODY | ACCEPTABLE | ACCEPTABLE | UN-ACCEPTABLE | UN-ACCEPTABLE | ACCEPTABLE | UN-ACCEPTABLE |
| SEVENTH WINDING BODY | ACCEPTABLE | ACCEPTABLE | UN-ACCEPTABLE | UN-ACCEPTABLE | ACCEPTABLE | UN-ACCEPTABLE |
| EIGHTH WINDING BODY | ACCEPTABLE | ACCEPTABLE | ACCEPTABLE | ACCEPTABLE | ACCEPTABLE | ACCEPTABLE |
| NINTH WINDING BODY | ACCEPTABLE | ACCEPTABLE | ACCEPTABLE | ACCEPTABLE | ACCEPTABLE | ACCEPTABLE |
| TENTH WINDING BODY | ACCEPTABLE | ACCEPTABLE | UN-ACCEPTABLE | UN-ACCEPTABLE | ACCEPTABLE | UN-ACCEPTABLE |
| ELEVENTH WINDING BODY | ACCEPTABLE | ACCEPTABLE | UN-ACCEPTABLE | UN-ACCEPTABLE | ACCEPTABLE | UN-ACCEPTABLE |
| TWELFTH WINDING BODY | ACCEPTABLE | ACCEPTABLE | ACCEPTABLE | ACCEPTABLE | ACCEPTABLE | ACCEPTABLE |
| THIRTEENTH WINDING BODY | ACCEPTABLE | ACCEPTABLE | ACCEPTABLE | ACCEPTABLE | ACCEPTABLE | ACCEPTABLE |
| FOURTEENTH WINDING BODY | ACCEPTABLE | ACCEPTABLE | ACCEPTABLE | ACCEPTABLE | ACCEPTABLE | ACCEPTABLE |
| FIFTEENTH WINDING BODY | ACCEPTABLE | ACCEPTABLE | ACCEPTABLE | ACCEPTABLE | ACCEPTABLE | ACCEPTABLE |
| SIXTEENTH WINDING BODY | ACCEPTABLE | ACCEPTABLE | ACCEPTABLE | ACCEPTABLE | ACCEPTABLE | ACCEPTABLE |
| SEVENTEENTH WINDING BODY | UN-ACCEPTABLE | — | UN-ACCEPTABLE | — | — | UN-ACCEPTABLE |
| EIGHTEENTH WINDING BODY | UN-ACCEPTABLE | — | ACCEPTABLE | — | — | UN-ACCEPTABLE |
| NINETEENTH WINDING BODY | UN-ACCEPTABLE | — | ACCEPTABLE | — | — | UN-ACCEPTABLE |
| TWENTIETH WINDING BODY | UN-ACCEPTABLE | — | ACCEPTABLE | — | — | UN-ACCEPTABLE |

FIG.25

| | BUCKLING BEND | | SLIPPAGE | | PLATE INCISION | JUDGEMENT RESULT |
|---|---|---|---|---|---|---|
| | BEFORE ETCHING | AFTER ETCHING | BEFORE ETCHING | AFTER ETCHING | | |
| FIRST WINDING BODY | ACCEPTABLE | ACCEPTABLE | UN-ACCEPTABLE | UN-ACCEPTABLE | UN-ACCEPTABLE | UN-ACCEPTABLE |
| SECOND WINDING BODY | ACCEPTABLE | ACCEPTABLE | UN-ACCEPTABLE | UN-ACCEPTABLE | UN-ACCEPTABLE | UN-ACCEPTABLE |
| THIRD WINDING BODY | ACCEPTABLE | ACCEPTABLE | UN-ACCEPTABLE | UN-ACCEPTABLE | UN-ACCEPTABLE | UN-ACCEPTABLE |
| FOURTH WINDING BODY | ACCEPTABLE | ACCEPTABLE | ACCEPTABLE | ACCEPTABLE | ACCEPTABLE | ACCEPTABLE |
| FIFTH WINDING BODY | ACCEPTABLE | ACCEPTABLE | ACCEPTABLE | ACCEPTABLE | ACCEPTABLE | ACCEPTABLE |
| SIXTH WINDING BODY | ACCEPTABLE | ACCEPTABLE | UN-ACCEPTABLE | UN-ACCEPTABLE | UN-ACCEPTABLE | UN-ACCEPTABLE |
| SEVENTH WINDING BODY | ACCEPTABLE | ACCEPTABLE | UN-ACCEPTABLE | UN-ACCEPTABLE | UN-ACCEPTABLE | UN-ACCEPTABLE |
| EIGHTH WINDING BODY | ACCEPTABLE | ACCEPTABLE | ACCEPTABLE | ACCEPTABLE | ACCEPTABLE | ACCEPTABLE |
| NINTH WINDING BODY | ACCEPTABLE | ACCEPTABLE | ACCEPTABLE | ACCEPTABLE | ACCEPTABLE | ACCEPTABLE |
| TENTH WINDING BODY | ACCEPTABLE | ACCEPTABLE | UN-ACCEPTABLE | UN-ACCEPTABLE | UN-ACCEPTABLE | UN-ACCEPTABLE |
| ELEVENTH WINDING BODY | ACCEPTABLE | ACCEPTABLE | UN-ACCEPTABLE | UN-ACCEPTABLE | UN-ACCEPTABLE | UN-ACCEPTABLE |
| TWELFTH WINDING BODY | ACCEPTABLE | ACCEPTABLE | ACCEPTABLE | ACCEPTABLE | ACCEPTABLE | ACCEPTABLE |
| THIRTEENTH WINDING BODY | ACCEPTABLE | ACCEPTABLE | ACCEPTABLE | ACCEPTABLE | ACCEPTABLE | ACCEPTABLE |
| FOURTEENTH WINDING BODY | ACCEPTABLE | UN-ACCEPTABLE | ACCEPTABLE | ACCEPTABLE | ACCEPTABLE | UN-ACCEPTABLE |
| FIFTEENTH WINDING BODY | ACCEPTABLE | ACCEPTABLE | ACCEPTABLE | ACCEPTABLE | ACCEPTABLE | ACCEPTABLE |
| SIXTEENTH WINDING BODY | ACCEPTABLE | ACCEPTABLE | ACCEPTABLE | ACCEPTABLE | ACCEPTABLE | ACCEPTABLE |
| SEVENTEENTH WINDING BODY | UN-ACCEPTABLE | — | UN-ACCEPTABLE | — | — | UN-ACCEPTABLE |
| EIGHTEENTH WINDING BODY | UN-ACCEPTABLE | — | ACCEPTABLE | — | — | UN-ACCEPTABLE |
| NINETEENTH WINDING BODY | UN-ACCEPTABLE | — | ACCEPTABLE | — | — | UN-ACCEPTABLE |
| TWENTIETH WINDING BODY | UN-ACCEPTABLE | — | ACCEPTABLE | — | — | UN-ACCEPTABLE |

FIG.26

METAL PLATE, METHOD OF MANUFACTURING METAL PLATE, AND METHOD OF MANUFACTURING MASK BY USE OF METAL PLATE

BACKGROUND OF THE INVENTION

Field of the Invention

The present invention relates to a metal plate for use in manufacturing a mask with a plurality of through-holes formed therein. In addition, the present invention relates to a method of manufacturing the metal plate. In addition, the present invention relates to a method of manufacturing the mask with a plurality of through-holes formed therein, by use of the metal plate.

Background Art

A display device used in a portable device such as a smart phone and a tablet PC is required to have high fineness, e.g., an image density not less than 300 ppi. In addition, there is increasing demand that the portable device is applicable in the full high-definitions standard. In this case, the image density of the display device needs to be 450 ppi or more.

An organic EL display device draws attention because of its excellent responsibility and low power consumption. A known method of forming pixels of an organic EL display device is a method which uses a deposition mask including through-holes that are arranged in a desired pattern, and forms pixels in the desired pattern. To be specific, a deposition mask is firstly brought into tight contact with a substrate for organic EL display device, and then the substrate and the deposition mask in tight contact therewith are put into a deposition apparatus so as to deposit an organic material and so on. In general, a deposition mask can be manufactured by forming through-holes in a metal plate by means of an etching process using photolithographic technique (for example, Patent Document 1). For example, a resist film is firstly formed on the metal plate. Then, the resist film, with which an exposure mask is in tight contact, is exposed to form a resist pattern. Thereafter, through-holes are formed by etching areas of the metal plate, which are not covered with the resist pattern.

Patent Document 1: JP2004-039319A

DISCLOSURE OF THE INVENTION

When a film of a deposition material is formed on a substrate with the use of a deposition mask, the deposition material adheres not only to the substrate but also to the deposition mask. For example, some of the deposition material moves toward the substrate along a direction largely inclined with respect to a normal direction of the deposition mask. Such a deposition material reaches a wall surface of a through-hole of the deposition mask and adheres thereto, before it reaches the substrate. In this case, the deposition material is not likely to adhere to an area of the substrate, which is located near the wall surface of the through-hole of the deposition mask, so that a thickness of the deposition material adhered to this area may be smaller than a thickness of another part and/or there may be a part to which no deposition material adheres. Namely, the deposition near the wall surface of the through-hole of the deposition mask may become unstable. Thus, when this deposition mask is used for forming pixels of an organic EL display device, dimensional precision of each pixel and positional precision thereof lower, which lowers luminous efficiency of the organic EL display device.

One of possible solutions to this problem is to reduce a thickness of a metal plate used for manufacturing a deposition mask. This is because, since the thickness of the metal plate is reduced, a height of a wall surface of a through-hole of a deposition mask can be reduced, whereby a rate of a deposition material, which adheres to the wall surface of the through-hole, can be lowered. However, in order to obtain a metal plate with a reduced thickness, it is necessary to increase a reduction ratio upon manufacture of the metal plate by rolling a base metal. The reduction ratio herein means a value obtained by a calculation of (thickness of base metal minus thickness of metal plate)/(thickness of base metal). Generally, the larger the reduction ratio is, the larger the non-uniformity degree of deformation caused by the rolling process becomes, even when a thermal treatment such as annealing is performed after the rolling process. For example, it is known that, since an elongation percentage of a metal plate differs depending on a position in a width direction (direction perpendicular to a transport direction of the base metal), the metal plate has a corrugation (corrugated shape). Specifically, there are a corrugation in an edge part in the width direction, which is called edge wave, and a corrugation in a middle part in the width direction, which is called middle wave. When a metal plate has such a corrugation, the tensile stress applied to the metal plate may become non-uniform in the width direction during the transport of the metal plate in a roll-to-roll fashion, which results in transport failure. The transport failure lowers an efficiency of a step in which a deposition mask is manufactured from the metal plate, and also lowers a throughput of deposition masks. Such a problem is not recognized in the prior technique, e.g., the above Patent Document 1.

A steepness degree is known as an index for representing a degree of the above corrugation formed in a plate member. The steepness degree is a percentage of a height of a corrugation with respect to a corrugation cycle of the plate member. For example, JP07-227620A proposes to that a rolled member has a steepness degree of not more than 1% in order to restrain warp upon half-etching. In addition, JP11-057812A employs the steepness degree as an index representing a flatness degree of a plate member, and proposes, when the steepness degree exceeds 1.5%, the plate member is subjected to a leveler passage at an extensibility of 1.0% or less. In addition, JP2003-286527A proposes that a copper or copper alloy material having a sufficiently flat shape is selected as a lead frame material, based on an index of 0.5% steepness degree. However, these documents do not disclose an idea of evaluating the steepness degree at respective positions in the width direction of a plate member. Thus, depending on an approach related to the steepness degree, the transport failure during the transport of a plate member may not be sufficiently prevented. These documents are related to neither a mask such as a deposition mask nor an invar alloy that is generally used as a material for constituting a deposition mask.

The present invention has been made in view of the above problems. The object of the present invention is to provide a metal plate used for manufacturing a mask such as a deposition mask, which can be stably transported. In addition, the object of the present invention is to provide a method of manufacturing the metal plate and a method of manufacturing the mask.

The present invention is a method of manufacturing a metal plate to be used for manufacturing a mask by forming a plurality of through-holes in the metal plate, the method comprising:

a rolling step of rolling a base metal to obtain the metal plate; and a cutting step of cutting off one end and the other end in a width direction of the metal plate over a predetermined range in the width direction;

wherein:

the through-holes of the mask are formed by etching the elongated metal plate that is being transported, the metal plate after the cutting step has at least partially a corrugation owing to a difference in lengths of the metal plate in a longitudinal direction depending on a position in the width direction of the metal plate;

when a percentage of a height of the corrugation with respect to a cycle in the longitudinal direction of the corrugation of the metal plate after the cutting step is referred to as steepness degree, the following three conditions (1) to (3) are satisfied:

(1) a maximum value of the steepness degree at a central area in the width direction of the metal plate after the cutting step is not more than 0.4%;

(2) the maximum value of the steepness degree at the central area is not more than a maximum value of the steepness degree at one end side area in the width direction of the metal plate after the cutting step, and is not more than a maximum value of the steepness degree at the other end side area in the width direction of the metal plate after the cutting step; and (3) a difference between the maximum value of the steepness degree at the one end side area and the maximum value of the steepness degree at the other end side area is not more than 0.4%; and the one end side area, the central area and the other end side area respectively correspond to areas occupying 30% of the width of the metal plate after the cutting step, 40% thereof and 30% thereof.

In the method of manufacturing a metal plate according to the present invention, the mask manufactured from the metal plate may be a deposition mask used for performing deposition in a desired pattern.

In the method of manufacturing a metal plate according to the present invention, the range on the one end side and the range on the other end side of the metal plate to be cut in the cutting step may be determined based on a result of an observation step of observing the corrugation of the metal plate, the observation step being performed before the cutting step.

The method of manufacturing a metal plate according to the present invention may further comprise an annealing step of annealing the metal plate obtained by the rolling step is annealed to remove an internal stress of the metal plate. In this case, the annealing step may be performed while the rolled base metal is being pulled in the longitudinal direction.

In the method of manufacturing a metal plate according to the present invention, the base metal may include an invar alloy.

The present invention is a metal plate to be used for manufacturing a mask by forming a plurality of through-holes in the metal plate, the metal plate comprising:

at least partially a corrugation owing to a difference in lengths of the metal plate in a longitudinal direction depending on a position in a width direction of metal plate;

wherein:

the through-holes of the mask are formed by etching the elongated metal plate that is being transported, when a percentage of a height of the corrugation with respect to a cycle in the longitudinal direction of the corrugation of the metal plate is referred to as steepness degree, the following three conditions (1) to (3) are satisfied:

(1) a maximum value of the steepness degree at a central area in the width direction of the metal plate is not more than 0.4%;

(2) the maximum value of the steepness degree at the central area is not more than a maximum value of the steepness degree at one end side area in the width direction of the metal plate, and is not more than a maximum value of the steepness degree at the other end side area in the width direction of the metal plate; and (3) a difference between the maximum value of the steepness degree at the one end side area and the maximum value of the steepness degree at the other end side area is not more than 0.4%; and the one end side area, the central area and the other end side area respectively correspond to areas occupying 30% of the width of the metal plate, 40% thereof and 30% thereof.

The mask manufactured from the metal plate according to the present invention may be a deposition mask used for performing deposition in a desired pattern.

The metal plate according to the present invention may include an invar alloy.

The present invention is a method of manufacturing a mask having a plurality of through-holes formed therein, comprising:

a step of preparing a metal plate, the metal plate having at least partially a corrugation owing to a difference in lengths of the metal plate in a longitudinal direction depending on a position in a width direction of the metal plate;

a resist-pattern forming step of forming a resist pattern on the metal plate; and an etching step of etching an area of the metal plate, which is not covered with the resist pattern, to form recesses in the metal plate, the recesses being configured to define the through-holes;

wherein when a percentage of a height of the corrugation with respect to a cycle in the longitudinal direction of the corrugation of the metal plate is referred to as steepness degree, the following three conditions (1) to (3) are satisfied:

(1) a maximum value of the steepness degree at a central area in the width direction of the metal plate is not more than 0.4%;

(2) the maximum value of the steepness degree at the central area is not more than a maximum value at one end side area in the width direction of the metal plate, and is not more than a maximum value of the steepness degree at the other end side area in the width direction of the metal plate; and (3) a difference between the maximum value of the steepness degree at the one end side area and the maximum value of the steepness degree at the other end side area is not more than 0.4%; and the one end side area, the central area and the other end side area respectively correspond to areas occupying 30% of the width of the metal plate, 40% thereof and 30% thereof.

In the method of manufacturing a mask according to the present invention, the mask may be a deposition mask used for performing deposition in a desired pattern. In this case, the deposition mask may include an effective area in which the plurality of through-holes are formed, and a surrounding area located around the effective area. In addition, the etching step may include a step of etching an area of the metal plate, which is not covered with the resist pattern, to form recesses in an area to be the effective area in the metal plate, the recesses being configured to define the through-holes.

In the method of manufacturing a mask according to the present invention, the resist-pattern forming step may include: a step of forming a resist film on the metal plate; a step of bringing an exposure mask into vacuum contact with the resist film; and a step of exposing the resist film in a predetermined pattern through the exposure mask.

In the method of manufacturing a mask according to the present invention, the metal plate may include an invar alloy.

According to the present invention, it is possible to select a metal plate that can be stably transported in a mask manufacturing step.

BRIEF DESCRIPTION OF THE DRAWINGS

FIG. 24 is a view showing a measurement result of steepness degrees of first to twentieth samples cut out from the first to twentieth winding bodies.

FIG. 25 is a view showing a transportability evaluation result in the elongated metal plates in the first embodiment obtained from the first to twentieth winding bodies.

FIG. 26 is a view showing a transport capability evaluation result in the elongated metal plates in the second embodiment obtained from the first to twentieth winding bodies.

DETAILED DESCRIPTION OF THE INVENTION

Figure 1:
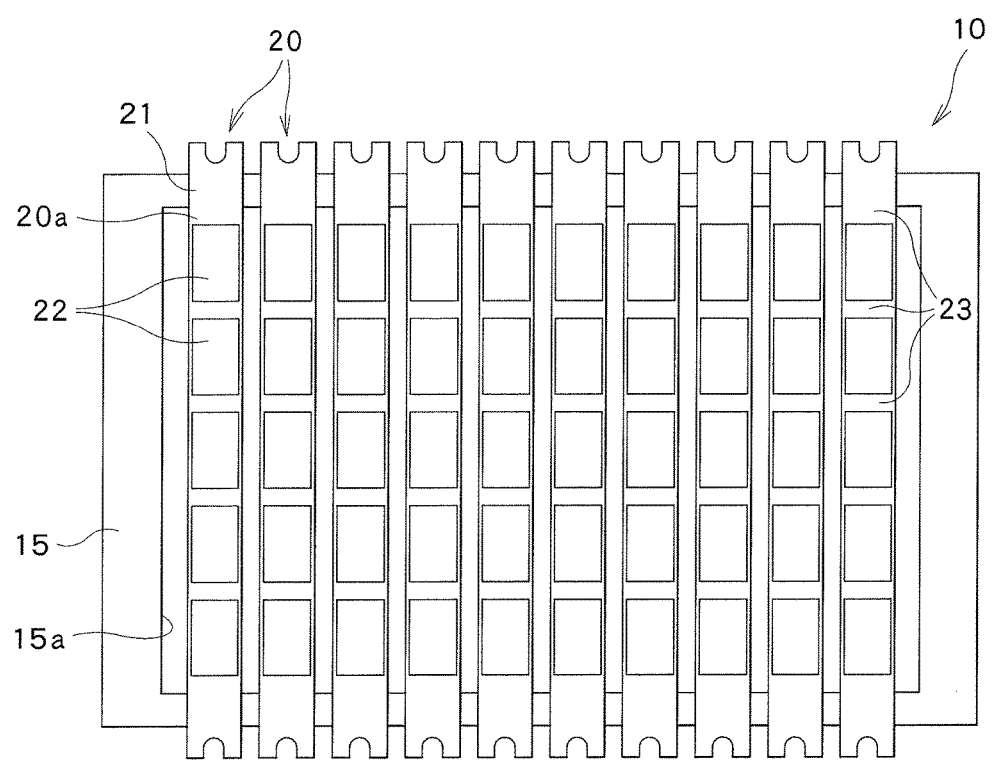
FIG. 1 is a view for explaining an embodiment of the present invention, which is a schematic plan view showing an example of a deposition mask apparatus including deposition masks.

An embodiment of the present invention will be described herebelow with reference to the drawings. In the drawings attached to the specification, a scale size, an aspect ratio and so on are changed and exaggerated from the actual ones, for the convenience of easiness in illustration and understanding.

FIGS. 1 to 20 are drawings for explaining an embodiment of the present invention. In the below embodiment and its modification examples, a method of manufacturing a deposition mask, which is used for patterning an organic material in a desired pattern on a substrate when an organic EL display device is manufactured, is described by way of example. However, not limited to this application, the present invention can be applied to a method of manufacturing a deposition mask to be used in various applications.

In this specification, the terms "plate", "sheet" and "film" are not differentiated from one another based only on the difference of terms. For example, the "plate" is a concept including a member that can be referred to as sheet or film. Thus, for example, "metal plate" is not differentiated from a member that is referred to as "metal sheet" or "metal film" based only on the difference of terms.

In addition, the term "plate plane (sheet plane, film plane)" means a plane corresponding to a plane direction of a plate-like (sheet-like, film-like) member as a target, when the plate-like (sheet-like, film-like) member as a target is seen as a whole in general. A normal direction used to the plate-like (sheet-like, film-like) member means a normal direction with respect to a plate plane (sheet surface, film surface) of the member.

Further, in this specification, terms specifying shapes, geometric conditions and their degrees, e.g., "parallel", "perpendicular", "same", "similar" etc., are not limited to their strict definitions, but construed to include a range capable of exerting a similar function.

(Deposition Mask Apparatus)

Figure 2:
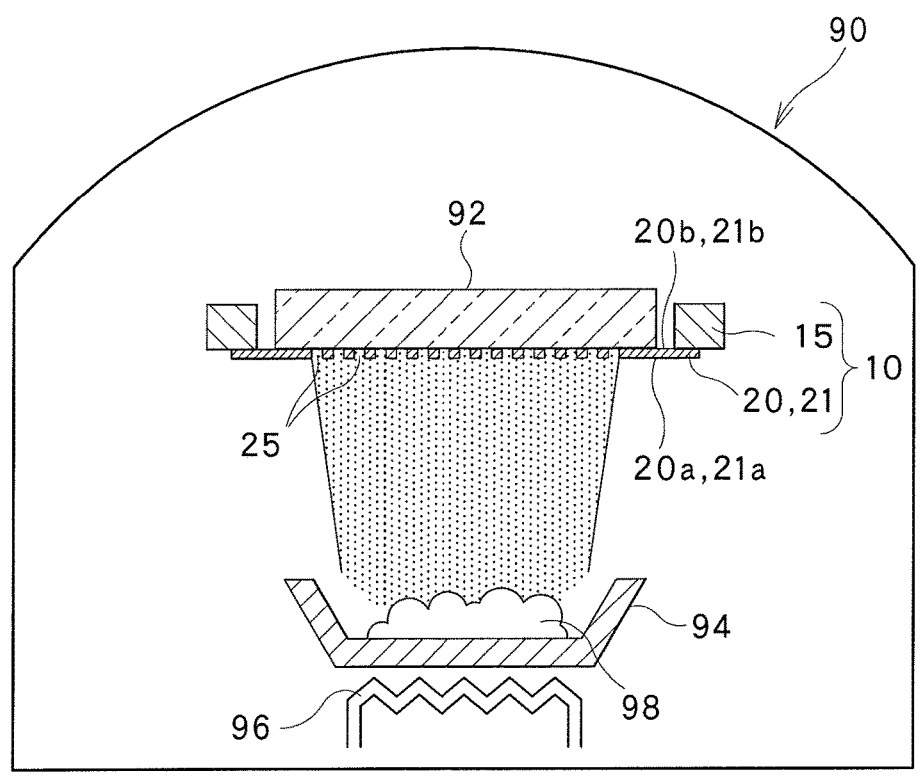
FIG. 2 is a view for explaining a deposition method by use of the deposition mask apparatus shown in FIG. 1.
Figure 3:
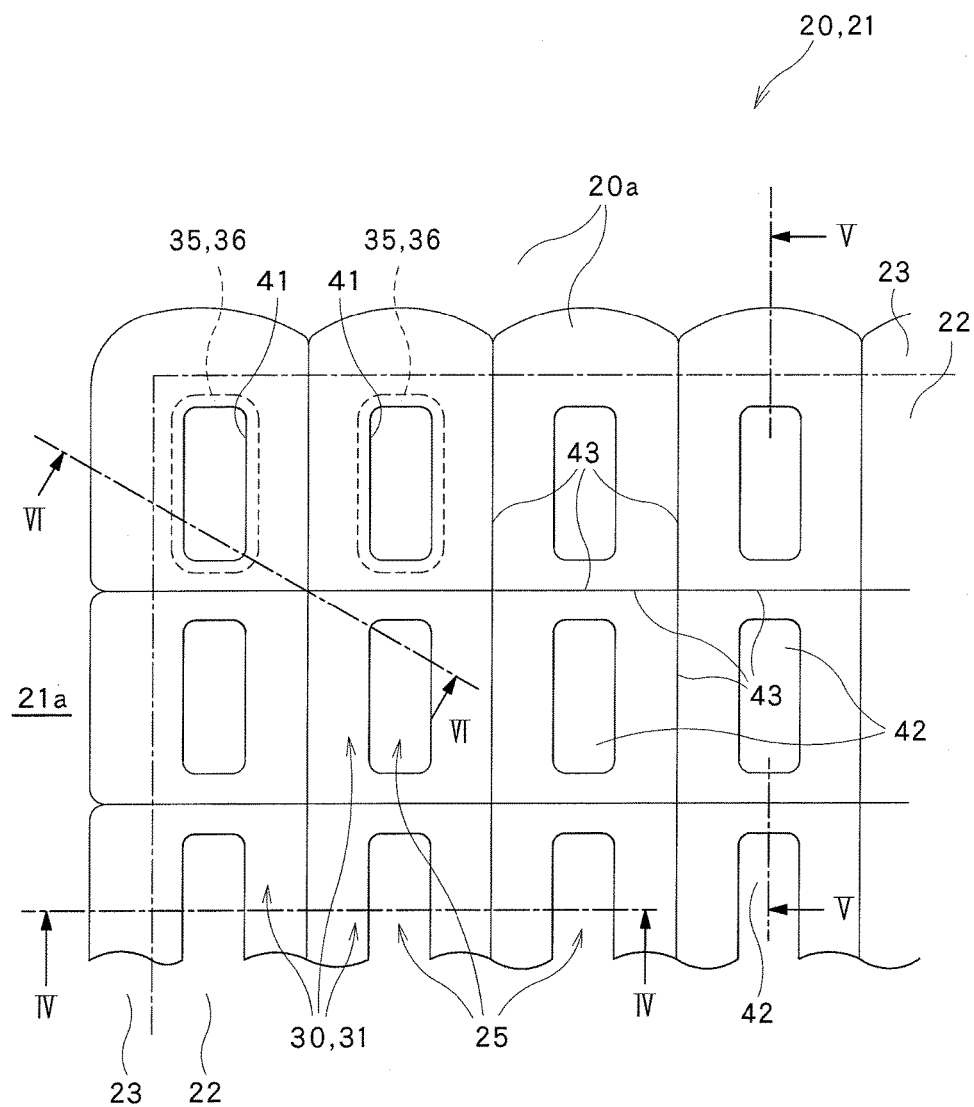
FIG. 3 is a partial plan view showing the deposition mask shown in FIG. 1.
Figure 4:
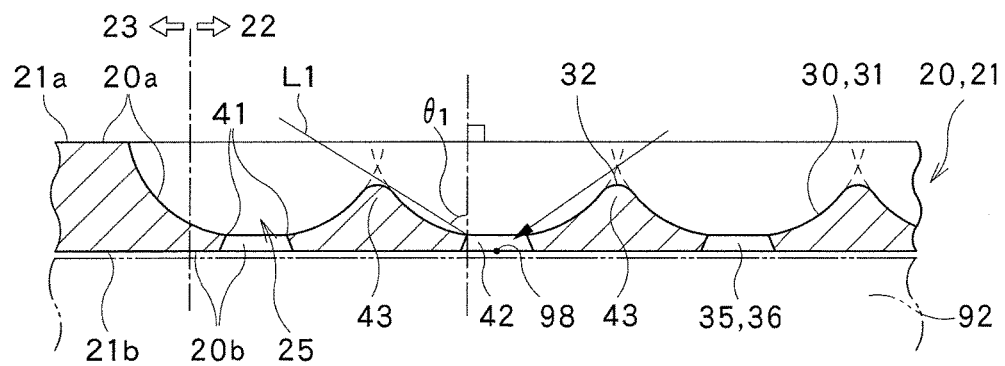
FIG. 4 is a sectional view taken along the line IV-IV of FIG. 3.
Figure 5:
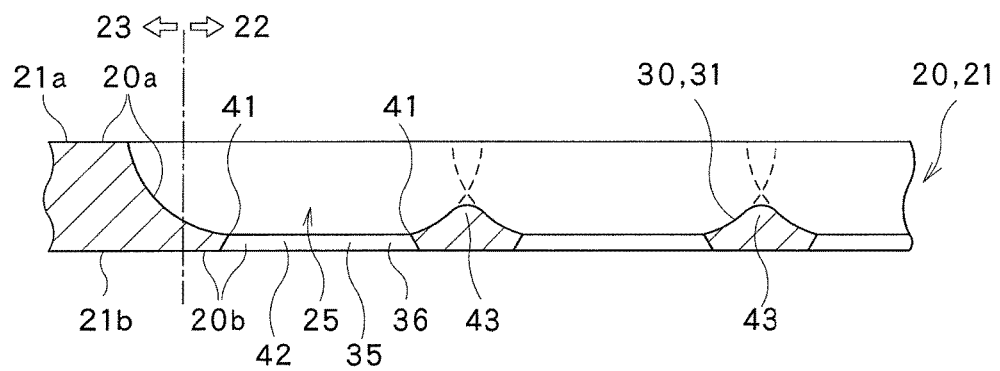
FIG. 5 is a sectional view taken along the line V-V of FIG. 3.
Figure 6:
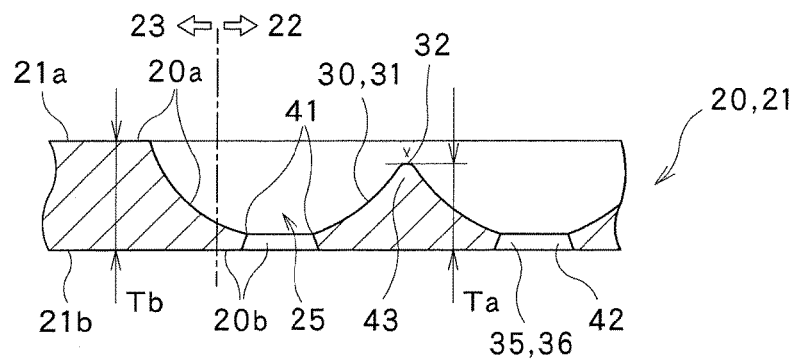
FIG. 6 is a sectional view taken along the line VI-VI of FIG. 3.

Firstly, an example of a deposition mask apparatus including deposition masks to be manufactured is described with reference mainly to FIGS. 1 to 6. FIG. 1 a plan view showing an example of the deposition mask apparatus including the deposition masks. FIG. 2 is a view for explaining a method of using the deposition mask apparatus shown in FIG. 1. FIG. 3 is a plan view showing the deposition mask seen from a first surface side. FIGS. 4 to 6 are sectional views seen from respective positions of FIG. 3.

The deposition mask apparatus 10 shown in FIGS. 1 and 2 includes a plurality of deposition masks 20 each of which is formed of a metal plate 21 of substantially a rectangular shape, and a frame 15 attached to peripheries of the deposition masks 20. Each deposition mask 20 has a number of through-holes 25 formed by etching the metal plate 21, which has a first surface 21a and a second surface 21b opposed to each other, at least from the first surface 21a. As shown in FIG. 2, the deposition mask apparatus 10 is used for depositing a deposition material to a substrate. The deposition mask apparatus 10 is supported in a deposition apparatus 90 such that the deposition mask 20 faces a lower surface of the substrate such as a glass substrate 92, onto which the deposition material is to be deposited.

In the deposition apparatus 90, the deposition mask 20 and the glass substrate 92 are brought into tight contact with each other by a magnetic force of magnets, not shown. In the deposition apparatus 90, there are disposed below the deposition mask apparatus 10 a crucible 94 storing a deposition material (e.g., organic luminescent material) 98 and a heater 96 for heating the crucible 94. The deposition material 98 in the crucible 94 is evaporated or sublimated by heat applied from the heater 96 so as to adhere to the surface of the glass substrate 92. As described above, since the deposition mask 20 has a lot of through-holes 25, the deposition material 98 adheres to the glass substrate 92 through the through-holes 25. As a result, a film of the deposition material 98 is formed on the surface of the glass substrate 92 in a desired pattern corresponding to the positions of the through-holes 25 of the deposition mask 20.

As described above, in this embodiment, the through-holes 25 are arranged in each effective area 22 in a predetermined pattern. When a color display is desired, an organic luminescent material for red color, an organic luminescent material for green color and an organic luminescent material for blue color may be sequentially deposited, while the deposition mask 20 (deposition mask apparatus 10) and the glass substrate 92 are relatively moved little by little along the arrangement direction of the through-holes 25 (aforementioned one direction).

The frame 15 of the deposition mask apparatus 10 is attached to the peripheries of the rectangular deposition masks 20. The frame 15 is configured to hold each deposition mask in a stretched state in order to prevent the deposition mask 20 from warping. The deposition masks 20 and the frame 15 are fixed with respect to each other by spot welding, for example.

The deposition process is performed inside the deposition apparatus 90 in a high-temperature. Thus, during the deposition process, the deposition masks 20, the frame 15 and the substrate 92, which are held inside the deposition apparatus 90, are also heated. At this time, each deposition mask 20, the frame 15 and the substrate 92 develop dimensional change behaviors based on their respective thermal expansion coefficients. In this case, when the thermal expansion coefficients of the deposition mask 20, the frame 15 and the substrate 92 largely differ from one another, positioning displacement occurs because of the difference in dimensional change. As a result, the dimensional precision and the positional precision of the deposition material to be adhered to the substrate 92 lower. In order to avoid this problem, the thermal expansion coefficient of the deposition mask 20 and the frame 15 is preferably equivalent to the thermal expansion coefficient of the substrate 92. For example, when the glass substrate 92 is used as the substrate 92, an invar alloy, which is an iron alloy obtained by adding to iron a predetermined amount of nickel, e.g., 36% by mass, may be used as a material of the deposition mask 20 and the frame 15.

(Deposition Mask)

Next, the deposition mask 20 is described in detail. As shown in FIG. 1, in this embodiment, each deposition mask 20 is formed of the metal plate 21, and has an outline of a substantially quadrangular shape in plan view, more precisely, a substantially rectangular shape in plan view. The metal plate 21 of the deposition mask 20 includes the effective area 22 in which the through-holes 25 are formed in a regular arrangement, and a surrounding area 23 surrounding the effective area 22. The surrounding area 23 is an area for supporting the effective area 22, and is not an area through which the deposition material intended to be deposited on the substrate passes. For example, in the deposition mask 20 for use in depositing an organic luminescent material for organic EL display device, the effective area 22 is an area in the deposition mask 20, which faces a section on the substrate (glass substrate 92) to which the organic luminescent material is deposited to form pixels, i.e., a section on the substrate which provides a display surface of the manufactured substrate for organic EL display device. However, for various reasons, the surrounding area 23 may have a through-hole and/or a recess. In the example shown in FIG. 1, each effective area 22 has an outline of a substantially quadrangular shape in plan view, more precisely, a substantially rectangular shape in plan view.

In the illustrated example, the effective areas 22 of the deposition masks 20 are arranged in line, at predetermined intervals therebetween, along one direction in parallel with a longitudinal direction of the deposition mask 20. In the illustrated example, one effective area 22 corresponds to one organic EL display device. Namely, the deposition mask apparatus 10 (deposition masks 20) shown in FIG. 1 enables a multifaceted deposition.

As shown in FIG. 3, in the illustrate example, the plurality of through-holes 25 formed in each effective area 22 are arranged at predetermined pitches along two directions perpendicular to each other. An example of the through-hole 25 formed in the metal plate 21 is described in more detail with reference mainly to FIGS. 3 to 6.

As shown in FIGS. 4 to 6, the plurality of through-holes 25 extend between the first surface 20a, which is one side along a normal direction of the deposition mask 20, and the second surface 20b, which is the other side along the normal direction of the deposition mask 20, to pass through the deposition mask 20. In the illustrated example, as described in more detail later, a first recess 30 is formed in the metal plate 21 by an etching process from the side of the first surface 21a of the metal plate 21, which is the one side in the normal direction of the deposition mask, and a second recess 35 is formed in the metal plate 21 from the side of the second surface 21b, which is the other side in the normal direction of the metal plate 21. The through-hole 25 is composed of the first recess 30 and the second recess 35.

As shown in FIGS. 3 to 6, a cross-sectional area of each first recess 30, in a cross section along a plate plane of the deposition mask 20 at each position along the normal direction of the deposition mask 20, gradually decreases from the side of the first surface 20a of the deposition mask 20 toward the side of the second surface 20b. As shown in FIG. 3, a wall surface 31 of the first recess 30 extends in its all area in a direction intersecting with the normal direction of the deposition mask 20, and is exposed to the one side along the normal direction of the deposition mask 20. Similarly, a cross-sectional area of each second recess 35, in a cross section along the plate plane of the deposition mask 20 at each position along the normal direction of the deposition mask 20, may gradually decrease from the side of the second surface 20b of the deposition mask 20 toward the side of the first surface 20a. A wall surface 36 of the second recess 35 extends in its all area in a direction intersecting with the normal direction of the deposition mask 20, and is exposed to the other side along the normal direction of the deposition mask 20.

As shown in FIGS. 4 to 6, the wall surface 31 of the first recess 30 and the wall surface 36 of the second recess 35 are connected via a circumferential connection portion 41. The connection portion 41 is defined by a ridge line of a bulging part where the wall surface 31 of the first recess 30, which inclined with respect to the normal direction of the deposition mask 20, and the wall surface 36 of the second recess 35, which is inclined with respect to the normal direction of the deposition mask 20, are merged with each other. The connection portion defines a through portion 42 where an area of the through-hole 25 is minimum in plan view of the deposition mask 20.

As shown in FIGS. 4 to 6, the two adjacent through-holes 25 in the other side surface along the normal direction of the deposition mask, i.e., in the second surface 20b of the deposition mask 20, are spaced from each other along the plate plane of the deposition mask. Namely, as in the below-described manufacturing method, when the second recesses 35 are made by etching the metal plate 21 from the side of the second surface 21b of the metal plate 21, which will correspond to the second surface 20b of the deposition mask 20, the second surface 21b of the metal plate 21 remains between the two adjacent recesses 35.

On the other hand, as shown in FIGS. 4 to 6, the two adjacent first recesses 30 are connected to each other on the one side along the normal direction of the deposition mask, i.e., on the side of the first surface 20a of the deposition mask 20. Namely, as in the below-described manufacturing method, when the first recesses 30 are made by etching the metal plate 21 from the side of the first surface 21a of the metal plate 21, which will correspond to the first surface 20a of the deposition mask 20, no first surface 21a of the metal plate 21 remains between the two adjacent first recesses 30. Namely, the first surface 21a of the metal plate 21 is etched as a whole over the effective area 22. According to the first surface 20a of the deposition mask 20 formed by these first recesses 30, when the deposition mask 20 is used such that the first surface 20a of the deposition mask 20 faces the deposition material 98 as shown in FIG. 2, a utilization efficiency of the deposition material 98 can be effectively improved.

As shown in FIG. 2, the deposition mask apparatus 10 is received in the deposition apparatus 90. In this case, as shown by the two-dot chain lines in FIG. 4, the first surface 20a of the deposition mask 20 is located on the side of the crucible 94 holding the deposition material 98, and the second surface 20b of the deposition mask 20 faces the glass substrate 92. Thus, the deposition material 98 adheres to the glass substrate 92 through the first recess 30 whose cross-sectional area gradually decreases. As shown by the arrow in FIG. 4 the deposition material 98 not only moves from the crucible 94 toward the glass substrate 92 along the normal direction of the glass substrate 92, but also sometimes moves along a direction largely inclined with respect to the normal direction of the glass substrate 92. At this time, when the thickness of the deposition mask 20 is large, most of the diagonally moving deposition material 98 reaches the wall surface 31 of the first recess 30, before the deposition material 98 passes through the through-hole 25 to reach the glass substrate 92. In this case, the area of the glass substrate 92 facing the through-hole 25 has an area where the deposition material 98 is likely to reach, and an area where the deposition material 98 is unlikely to reach. Thus, in order that the utilization efficiency (a film-deposition efficiency: a rate of the deposition material adhering to the glass substrate 92) of the deposition material can be enhanced to save the expensive deposition material, and that a film of the expensive deposition material can be stably and uniformly formed in the desired area, it is important to constitute the deposition mask 20 such that the diagonally moving deposition material 98 is made to reach the glass substrate 92 as much as possible. Namely, it is advantageous to sufficiently increase a minimum angle θ1 (see FIG. 4) that is defined by a line L1, which passes, in the cross sections of FIGS. 4 to 6 perpendicular to the sheet plane of the deposition mask 20, the connection portion 41 having the minimum cross-sectional area of the through-hole 25 and another given position of the wall surface 31 of the first recess 30, with respect to the normal direction of the deposition mask 20.

One of possible methods of increasing the angle θ1 is that the thickness of the deposition mask 20 is reduced so that the height of the wall surface 31 of the first recess 30 and the height of the wall surface 36 of the second recess 35 are reduced. Namely, it can be said that the metal plate 21, which has a thickness as small as possible within a range in which the strength of the deposition mask 20 is ensured, is preferably used as the metal plate 21 constituting the deposition mask 20.

As another possible method of increasing the angle θ1 is that the outline of the first recess 30 is made optimum. For example, according to this embodiment, since the wall surfaces 31 of the two adjacent first recesses 30 are merged with each other, the angle θ1 is allowed to be significantly large (see FIG. 4), as compared with a recess that does not merge with another recess, whose wall surfaces (outlines) are shown by the dotted lines. A reason therefor is described below.

As described in detail later, the first recess 30 is formed by etching the first surface 21a of the metal plate 21. In general, a wall surface of the recess formed by etching has a curved shape projecting toward the erosion direction. Thus, the wall surface 31 of the recess formed by etching is steep in. an area where the etching starts, and is relatively largely inclined in an area opposed to the area where the etching starts, i.e., the at the deepest point of the recess. On the other hand, in the illustrated deposition mask 20, since the wall surfaces 31 of the two adjacent first recesses 30 merge on the side where the etching starts, an outline of a portion 43 where distal edges 32 of the wall surfaces 31 of the two first recesses 30 are merged with each other has a chamfered shape instead of a steep shape. Thus, the wall surface 31 of the first recess 30 forming a large part of the through-hole 25 can be effectively inclined with respect to the normal direction of the deposition mask. That is to say, the angle θ1 can be made large. Thus, the deposition in a desired pattern can be precisely and stably performed, while the utilization efficiency of the deposition material 98 can be effectively improved.

(Material)

A material (metal plate) for constituting the above-described deposition mask 20 is described below. As described below, the sheet-like metal plate 21 constituting the deposition masks 20 is obtained from an elongated metal plate made by rolling a base metal. Thus, in order to obtain the metal plate 21 having a reduced thickness, it is necessary to increase a reduction ratio when an elongated metal plate is manufactured by rolling the base metal. However, the larger the reduction ratio is, the larger the non-uniformity degree of deformation caused by rolling becomes. For example, when an extensibility of the elongated metal plate differs depending on a position in a width direction (direction perpendicular to a transport direction of the base metal), the elongated metal plate may have the aforementioned corrugation.

The etching step for forming through-holes in the elongated metal plate is generally performed to an elongated metal plate that is transported in a roll-to-roll fashion. Thus, excellent easiness in transport of the metal plate is preferred in order to efficiently perform the etching step. However, as the thickness of the elongated metal plate reduces, it becomes more and more difficult to transport the elongated metal plate. For example, as the thickness of the elongated metal plate reduces, "slippage" in which a transport direction of the elongated metal plate displaces from an ideal transport direction, and/or "buckling bend", in which the elongated metal plate bends along its longitudinal direction when a tensile stress is applied to the elongated metal plate, tend to occur. The buckling bend is particularly likely to occur from a roller or the like as a starting point, which converts a transport direction of the elongated metal plate. In addition, when the elongated metal plate has the aforementioned corrugation, the slippage and the buckling bend are more likely to occur. This is because the corrugation makes non-uniform a pressure, which is applied to the elongated metal plate by a roller for converting a transport direction of the elongated metal plate, in the width direction. At a position to which no pressure is applied, the elongated metal plate floats up from the roller. Further, the elongated metal plate may not only float up but also possibly bend. In addition, the fact that a pressure, which is applied to the elongated metal plate by a pair of transport rollers transporting the elongated metal plate while sandwiching the elongated metal plate therebetween, tends to be non-uniform in the width direction may be considered as one of the causes for inviting the slippage and the buckling bend. Thus, in order to efficiently perform the etching step, it is important to select and use an elongated metal plate which is resistant to the slippage and the buckling bend. As described below, this embodiment proposes selection of an elongated metal plate by using as an index a steepness degree of an elongated metal plate, which is calculated at each position in a width direction. A definition of the steepness degree is described later.

Next, an operation and an effect of this embodiment as structured above are described. Here, a method of manufacturing a metal plate for use in manufacturing a deposition mask is described firstly. Then, a method of manufacturing a deposition mask by use of the obtained metal plate is described. Thereafter, a method of depositing a deposition material onto a substrate by use of the obtained deposition mask is described.

(Method of Manufacturing Metal Plate)

Figure 7A:
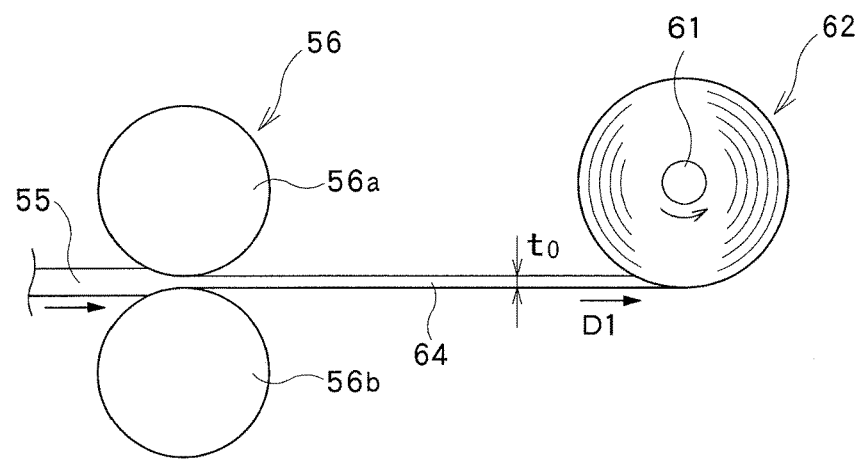
FIG. 7A is a view showing a step of rolling a base metal to obtain a metal plate having a desired thickness.
Figure 7B:
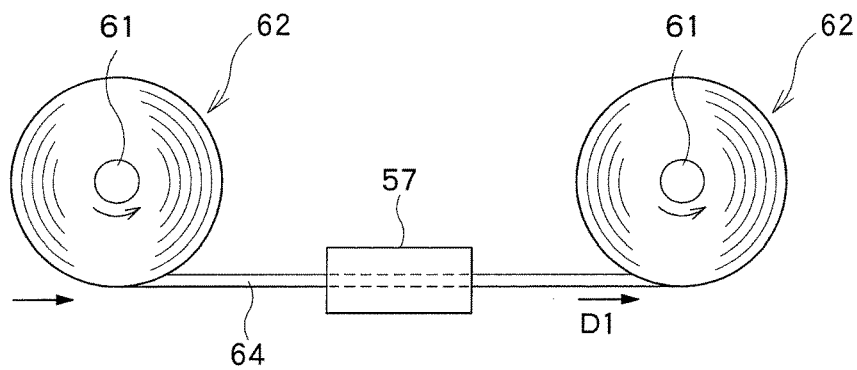
FIG. 7B is a view showing a step of annealing the metal plate obtained by rolling.

A method of manufacturing a metal plate is firstly described with reference to FIGS. 7A, 7B, FIG. 8, FIGS. 9A, 9B, 9C, 9D and FIG. 10. FIG. 7A is a view showing a step of rolling a base metal to obtain a metal plate having a desired thickness. FIG. 7B is a view showing a step of annealing the metal plate obtained by the rolling process.

<Rolling Step>

As shown in FIG. 7A, a base metal 55 formed of an invar alloy is prepared, and the base metal 55 is transported toward a rolling apparatus 56 including a pair of reduction rolls 56a and 56b along a transport direction shown by the arrow D1. The base metal 55 having reached between the pair of reduction rolls 56a and 56b is rolled by the pair of reduction rolls 56a and 56b. Thus, a thickness of the base metal 55 is reduced and is elongated along the transport direction. As a result, an elongated metal plate 64 having a thickness $t_0$ can be obtained. As shown in FIG. 7A, a winding body 62 may be formed by winding up the elongated metal plate 64 around a core 61. Although a value of the thickness $t_0$ is not particularly limited, the value is within a range between 0.020 mm and 0.100 mm, for example.

FIG. 7A merely shows the rolling step schematically, and a concrete structure and procedure for performing the rolling step are not specifically limited. For example, the rolling step may include a hot rolling step for heating the metal plate at a temperature not less than a recrystallization temperature of the invar alloy forming the base metal 55, and a cold rolling step for processing the base metal at a temperature not more than the recrystallization temperature of the invar alloy.

<Slitting Step>

After that, there may be performed a slitting step for slitting both ends of the elongated metal plate 64, which is obtained by the rolling step, in the width direction thereof, over a range of 3 mm to 5 mm. The slitting step is performed to remove a crack that may be generated on both ends of the elongated metal plate 64 because of the rolling step. Due to the slitting step, it can be prevented that a breakage phenomenon of the elongated metal plate 64, which is so-called plate incision, occurs from the crack as a starting point.

<Annealing Step>

After that, in order to remove a remaining stress accumulated by the rolling process in the elongated metal plate 64, as shown in FIG. 7B, the elongated metal plate 64 is annealed by using an annealing apparatus 57. As shown in FIG. 7B, the annealing step may be performed while the elongated metal plate 64 is being pulled in the transport direction (longitudinal direction). Namely, the annealing step may be performed as a continuous annealing process while the elongated metal plate is being transported, instead of a batch-type annealing process. A duration of the annealing step is suitably set depending on a thickness of the elongated metal plate 64 and a reduction ratio thereof. For example, the annealing step is performed at 500° C. for 60 seconds. The above "60 seconds" mean that it takes 60 seconds for the elongated metal plate 64 to pass through a space, which is heated at 500° C., in the annealing apparatus 57.

Due to the annealing step, it is possible to obtain the elongated metal plate 64 of a thickness $t_0$, from which the remaining stress is removed to a certain extent. The thickness $t_0$ is generally equal to a maximum thickness Tb in the surrounding area 23 of the deposition mask 20.

The elongated metal plate 64 having the thickness $t_0$ may be made by repeating the above rolling step, the slitting step and the annealing step plural times. FIG. 7B shows the example in which the annealing step is performed while the elongated metal plate 64 is being pulled in the longitudinal direction. However, not limited thereto, the annealing step may be performed to the elongated metal plate 64 that is wound around the core 61. Namely, the batch-type annealing process may be performed. When the annealing step is performed while the elongated metal plate 64 is wound around the core 61, the elongated metal plate 64 may have a warping tendency corresponding to a winding diameter of the winding body 62. Thus, depending on a winding diameter of the winding body 62 and/or a material forming the base metal 55, it is advantageous to perform the annealing step while the elongated metal plate 64 is being pulled in the longitudinal direction.

<Cutting Step>

After that, there is performed a cutting step of cutting off both ends of the elongated metal plate 64 in the width direction thereof over a predetermined range, so as to adjust the width of the elongated metal plate 64 into a desired width. Thus, the elongated metal plate 64 having a desired thickness and a desired width can be obtained.

<Inspection Step>

Figure 8:
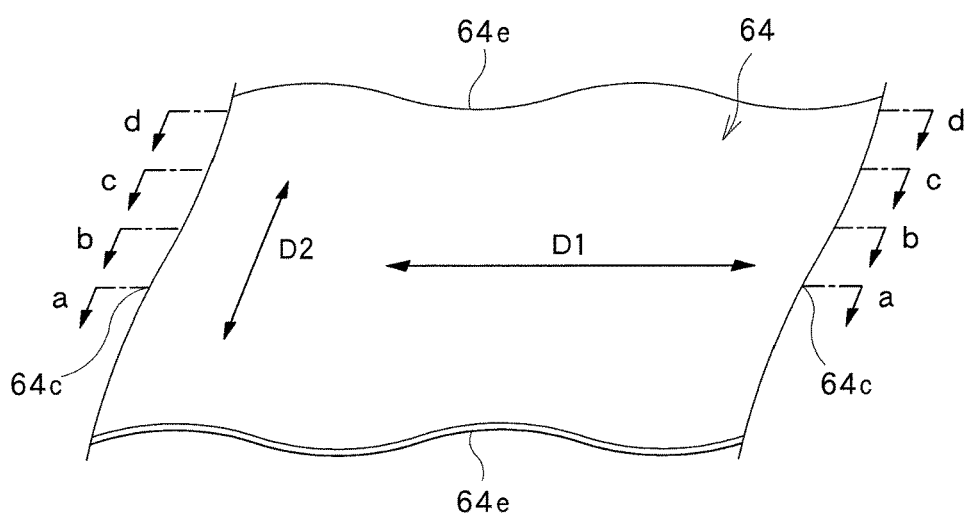
FIG. 8 is a perspective view showing the metal plate obtained by the steps shown in FIGS. 7A and 7B.

After that, an inspection step of inspecting a steepness degree of the obtained elongated metal plate 64 is performed. FIG. 8 is a perspective view showing the elongated metal plate 64 obtained by the steps shown in FIGS. 7A and 7B. As shown in FIG. 8, the elongated metal plate 64 at least partially has a corrugation owing to a difference in lengths of the metal plate in a longitudinal direction depending on a position in the width direction D2. The longitudinal direction D1 is a direction in parallel with the transport direction when the base metal 55 is rolled. The width direction D2 is a direction perpendicular to the longitudinal direction D1. In FIG. 8, each end position of the elongated metal plate 64 in the width direction D2 is indicated by a symbol 64e.

Figure 9A:
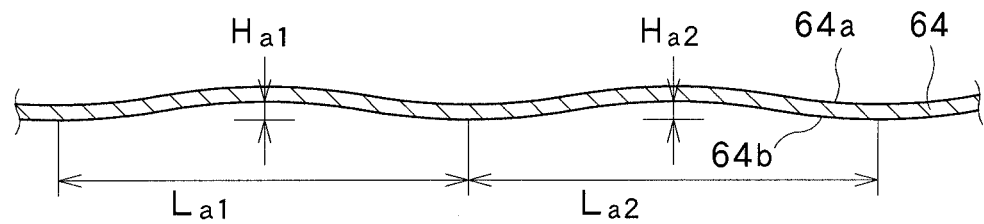
FIGS. 9A, 9B, 9C and 9D are sectional view taken along the line a-a of FIG. 8, the line b-b thereof, the line c-c thereof, and the line d-d thereof, respectively.
Figure 9B:
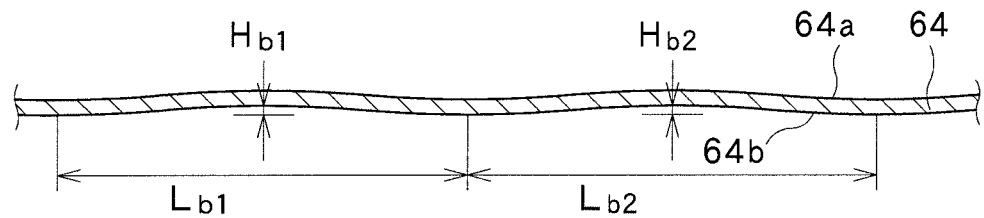
Figure 9C:
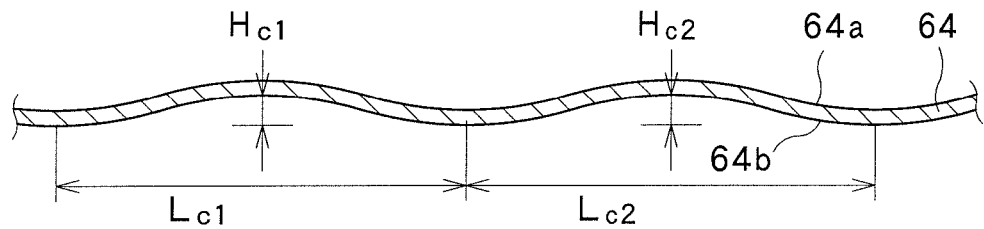
Figure 9D:
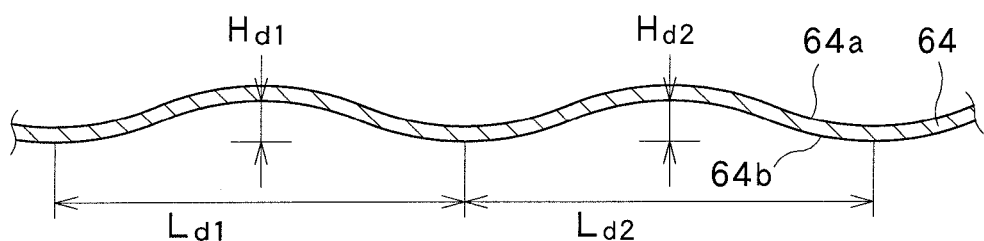

The corrugation of the elongated metal plate 64 is described. FIGS. 9A, 9B, 9C and 9D are sectional views along the a-a line of FIG. 8, the b-b line thereof, the c-c line thereof and the d-d line thereof, respectively. The a-a line of FIG. 8 is a line extending in the longitudinal direction along a central position 64c of the elongated metal plate 64 in the width direction thereof. Thus, FIG. 9A shows a cross section of the elongated metal plate 64 in the central position 64c in the width direction of the elongated metal plate 64. The d-d line of FIG. 8 is a line extending in the longitudinal direction along the end position 64e in the width direction of the elongated metal plate 64. Thus, FIG. 9D shows a cross section of the elongated metal plate 64 in the end position 64e in the width direction of the elongated metal plate 64. The elongated metal plate 64 in this embodiment has a middle wave, so that a degree of the corrugation appearing in the elongated metal plate 64 at the central position 64c in the width direction is greater than a degree of the corrugation appearing in the elongated metal plate 64 at a position slightly distant from the central position 64c, e.g., at the position of the b-b line of FIG. 8. In addition, the elongated metal plate 64 in this embodiment also has an edge wave, so that a degree of the corrugation appearing in the elongated metal plate 64 at the end position 64e is greater than a degree of the corrugation appearing in the elongated metal plate 64 at a position slightly distant from the end position 64e, e.g., at the position of the c-c line of FIG. 8.

In the inspection step, a steepness degree at each position in the width direction of the elongated metal plate 64 is calculated. The "steepness degree" is a percentage (%) of a height H of the corrugation with respect to a cycle L in the longitudinal direction of the corrugation of the elongated metal plate 64, i.e., H/L×100(%). The "cycle" is a distance between valleys in the corrugation of the elongated metal plate 64. The "height" is a distance between an apex of a peak of the corrugation and a line connecting valleys.

For example, FIG. 9A shows two peaks present in the corrugation along the a-a line of FIG. 8. The cycles are represented by the symbols $L_{a1}$ and $L_{a2}$, and the heights are represented by the symbols $H_{a1}$ and $H_{a2}$. Although not shown, a longitudinal range of the elongated metal plate 64 whose steepness degree is to be calculated has a lot of further peaks present in the corrugation along the a-a line in FIG. 8. For example, on the assumption that there are peaks the number of which is na, a cycle of each peak is represented by $L_{ana}$, and a height of each peak is represented by $H_{ana}$ (na is a positive integer), the steepness degree of each peak is $H_{ana}/L_{ana} \times 100(\%)$. In addition, the steepness degree at the position along the a-a line of FIG. 8 is calculated as an average value of the steepness degrees of the peaks (the number of which is na), i.e., an average value of $H_{ana}/L_{ana} \times 100(\%)$ (na is a positive integer).

Similarly to the steepness degree at the position along the a-a line of FIG. 8, the steepness degrees at the positions along the b-b line of FIG. 8, the c-c line thereof and the d-d line thereof are respectively calculated as average values of $H_{bnb}/L_{bnb} \times 100(\%)$ (nb is a positive integer), $H_{cnc}/L_{cnc} \times 100(\%)$ (nc is a positive integer) and $H_{dnd}/L_{dnd} \times 100(\%)$ (nd is a positive integer).

The method of calculating the cycle and the height of the corrugation of the elongated metal plate 64 is not particularly limited. For example, when the cycle $L_{ana}$ and the height $H_{ana}$ of each peak in the corrugation of the elongated metal plate 64 at the position along the a-a line of FIG. 8, i.e., at the central position 64c are calculated, a distance measuring apparatus capable of measuring a distance between it and an object is used to scan the central position 64c in the width direction D2 on the elongated metal plate 64 along the longitudinal direction D1 of the elongated metal plate 64, so as to measure along the longitudinal direction D1 height positions of the surface of the elongated metal plate 64 at predetermined intervals. The interval is within a range of 1 mm and 5 mm, for example. Thus, a three-dimensional profile of the elongated metal plate 64 at the central position 64c can be obtained. In addition, the the cycle $L_{ana}$ and the height $H_{ana}$ of each peak can be calculated by analyzing the three-dimensional profile. A curved line smoothly connecting the respective measured points may be employed as a three-dimensional profile.

By repeating such measurement at different positions in the width direction D2, the cycle and the height in the corrugation of the elongated metal plate 64 can be calculated at each position in the width direction D2.

Figure 10:
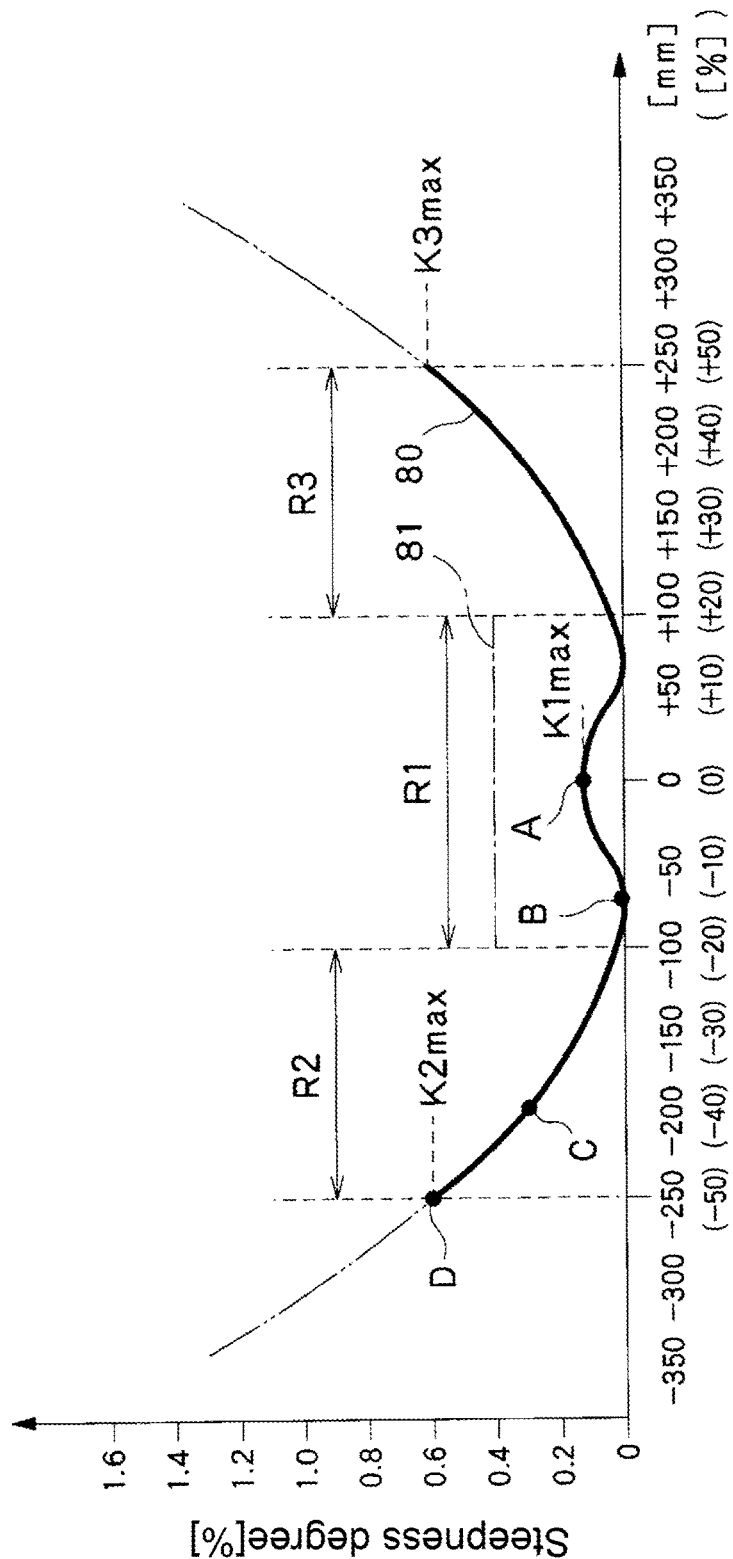
FIG. 10 is a view showing a steepness degree at each position of the metal plate in a width direction thereof.

FIG. 10 is a graph showing the steepness degree calculated at each position in the width direction D2 of the elongated metal plate 64. In FIG. 10, the axis of abscissa shows a position in the width direction D2 of the elongated metal plate 64, and the axis of ordinate shows a steepness degree. FIG. 10 shows a curved line 80 smoothly connecting the steepness degree values calculated at each position in the width direction D2 of the elongated metal plate 64. Below the axis of abscissa in FIG. 10, an upper row shows, in unit of millimeter, a position in the width direction D2 from the central position 64c in the width direction D2 as an origin. The lower row below the axis of abscissa in FIG. 10 shows, in unit of %, a rate of a position in the width direction D2 with respect to an entire width of the elongated metal plate 64. Referring to FIG. 10, there is described a case in which an elongated metal plate having an entire width of 500 mm is used as the elongated metal plate 64 for manufacturing the deposition masks 20. Thus, for example, a rate of a position distant from the central position 64c in the width direction D2 by +100 mm is shown as +20%. In addition, in FIG. 10, the steepness degrees of the elongated metal plate 64 at the positions of the a-a line of FIG. 8, the b-b line thereof, the c-c line thereof and the d-d line thereof are indicated by the symbols A, B, C and D.

After the steepness degree was calculated at each position in the width direction D2 of the elongated metal plate 64, the selection of the elongated metal plate 64 is carried out based on the steepness degree value. Herein, the selection of the elongated metal plate 64 is carried out in such a manner that only an elongated metal plate 64 satisfying all the below conditions (1) to (3) is selected and used in the below-described manufacturing step of the deposition masks 20.

(1) A maximum value $K1_{max}$ of a steepness degree at a central area R1 in the width direction D2 of the elongated metal plate 64 is not more than 0.4%.

(2) The maximum value $K1_{max}$ of the steepness degree at the central area R1 in the width direction D2 of the elongated metal plate 64 is not more than a maximum value $K2_{max}$ at one end side area R2 in the width direction D2 of the elongated metal plate 64, and is not more than a maximum value $K3_{max}$ at the other end side area R3 in the width direction D2 of the elongated metal plate 64.

(3) A difference between the maximum value $K2_{max}$ of the steepness degree at the one end side area R2 and the maximum value $K3_{max}$ of the steepness degree at the other end side area R3 is not more than 0.4%.

Herebelow, the conditions (1) to (3) are examined respectively. In FIG. 10, the central area of the elongated metal plate 64 is indicated by the symbol R1. The one end side area, which is located nearer to one end side in the width direction of the elongated metal plate 64 than the central area R1, is indicated by the symbol R2. The other end side area, which is located nearer to the other end side in the width direction of the elongated metal plate 64 than the central area R1, is indicated by the symbol R3. The one end side area R2, the central area R1 and the other end side area R3 respectively correspond to areas occupying 30% of the width of the elongated metal plate 64 after the cutting step, 40% thereof and 30% thereof.

As shown in FIG. 10, in the elongated metal plate 64 having the middle wave and the edge wave, a maximal value of the steepness degree appears (point A) in the vicinity of the central position 64c in the width direction of the elongated metal plate 64. A minimal value of the steepness degree appears (point B) at a position slightly distant from the central position in the width direction of the elongated metal plate 64 toward the one end side or the other end side. The steepness degree increases (point C), as a certain point approaches from the point B toward the one end side or the other end side. The steepness degree value becomes maximum (point D) at the one end or the other end in the width direction. A reference line 81 showing 0.4% of steepness degree is drawn in the central area R1. In this case, when the curved line 80 of the steepness degree is located below the reference line 81, it means that the above condition (1) is satisfied. In the example shown in FIG. 10, the above condition (1) is satisfied.

As to the condition (2), it is judged whether the maximum value $K1_{max}$ of the steepness degree at the central area R1 in the width direction D2 of the elongated metal plate 64 is not more than a maximum value $K2_{max}$ at one end side area R2 in the width direction D2 of the elongated metal plate 64, and whether the maximum value $K1_{max}$ is not more than a maximum value $K3_{max}$ at the other end side area R3 in the width direction D2 of the elongated metal plate 64. In the example shown in FIG. 10, the above condition (2) is satisfied.

As to the condition (3), it is judged whether the difference between the maximum value $K2_{max}$ of the steepness degree at the one end side area R2 and the maximum value $K3_{max}$ of the steepness degree at the other end side area R3 is not more than 0.4%. In the example shown in FIG. 10, the above condition (3) is satisfied.

Due to such a selection, even when the elongated metal plate 64 has a corrugation because of a large reduction ratio of the elongated metal plate 64, it is possible to judge beforehand whether such a corrugation degree has a negative influence on the succeeding manufacturing step of the deposition masks 20. Thus, the production efficiency and the throughput of the deposition masks 20 made out of the elongated metal plate 64 can be improved.

The method of obtaining the elongated metal plate 64 with an entire width of 500 mm, which has the curved line 80 of the steepness degree as shown in FIG. 10, is not particularly limited.

For example, an elongated metal plate having an entire width greater than 500 mm, e.g., 700 mm is made by rolling the base metal 55. Thereafter, the aforementioned cutting step, in which both ends of the elongated metal plate in the width direction thereof are cut over a predetermined range, is performed so that an elongated metal plate 64 of 500 mm in width is made. At this time, in the elongated metal plate having an entire width of 700 mm, which is not yet subjected to the cutting step, an area having a significantly large steepness degree, i.e., an area having a steepness degree greater than 1%, for example, may possibly exist, as shown by the two-dot chain lines in FIG. 10. In addition, an area having a relatively small steepness degree may possibly exist at a position displaced from the center of the elongated metal plate of 700 mm in width. In this case, both ends of the elongated metal plate of 700 mm in width may be cut non-uniformly, instead of uniformly cutting both ends in the width direction of the elongated metal plate over a predetermined range.

For example, prior to the cutting step, an observation step of observing the corrugation of the elongated metal plate having an entire width of 700 mm is performed. The observation step may be performed visually by an operator or performed with the use of the aforementioned distance measuring apparatus.

At this time, for example, if it is confirmed that there is a wide area having a relatively large steepness degree on one end side of the elongated metal plate, the cutting step may be performed such that the one end side of the elongated metal plate having an entire width of 700 mm is cut in a wider manner as compared with the other end side thereof. For example, the elongated metal plate may be cut by 150 mm on the one end side, and by 50 mm on the other end side.

In addition, if an area having a relatively small steepness degree is located at a position displaced from the center of the elongated metal plate of 700 mm in width to the one end side, the cutting step may be performed such that the area having a relatively smaller steepness degree is centered to correspond to the central area R1 of the elongated metal plate 64 of 700 mm in width after the cutting step. For example, the elongated metal plate may be cut by 50 mm on the one end side, and by 150 mm on the other end side.

As described above, by determining an area of the elongated metal plate to be cut in the cutting step based on a result of the observation step, an elongated metal plate 64 having a more ideal steepness degree profile can be obtained.

(Method of Manufacturing Deposition Mask)

Next, a method of manufacturing the deposition mask 20 by use of the elongated metal plate 64 selected as described above is described with reference to FIGS. 11 to 20. In the below-described method of manufacturing the deposition mask 20, as shown in FIG. 11, the elongated metal plate 64 is supplied, the through-holes 25 are formed in the elongated metal plate 64, and the elongated metal plate 64 are severed so that the deposition masks 20 each of which is formed of the sheet-like metal plate 21 are obtained.

To be more specific, the method of manufacturing a deposition mask 20 includes a step of supplying an elongated metal plate 64 that extends like a strip, a step of etching the elongated metal plate 64 using the photolithographic technique to form a first recess 30 in the elongated metal plate 64 from the side of a first surface 64a, and a step of etching the elongated metal plate 64 using the photolithographic technique to form a second recess 35 in the elongated metal plate 64 from the side of a second surface 64b. When the first recess 30 and the second recess 35, which are formed in the elongated metal plate 64, communicate with each other, the through-hole 25 is made in the elongated metal plate 64. In the example shown in FIG. 11, the step of forming the second recess 35 is performed before the step of forming the first recess. In addition, between the step of forming the second recess 35 and the step of forming the first recess 30, there is further provided a step of sealing the thus made second recess 35. Details of the respective steps are described below.

Figure 11:
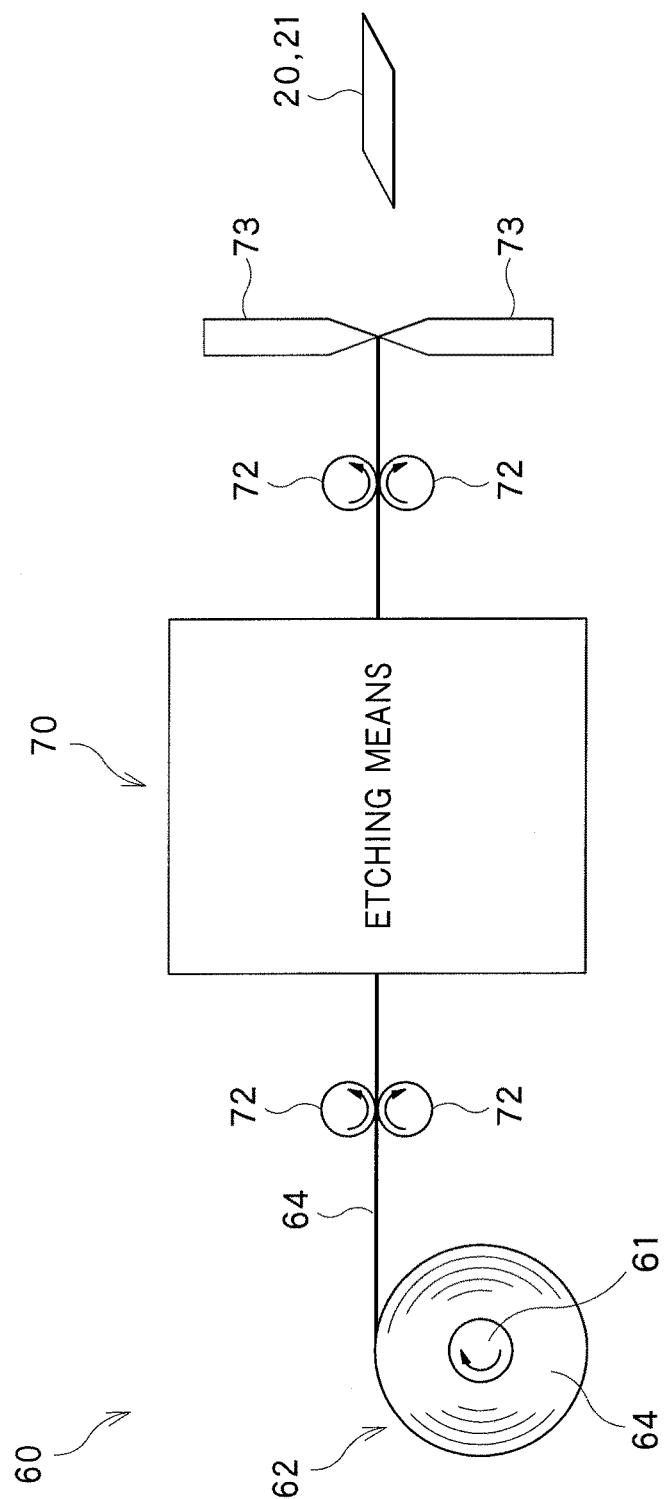
FIG. 11 is a schematic view generally explaining an example of a method of manufacturing the deposition mask show in FIG. 1.

FIG. 11 shows a manufacturing apparatus 60 for making the deposition masks 20. As shown in FIG. 11, the winding body 62 having the core 61 around which the elongated metal plate 64 is wound is firstly prepared. By rotating the core 61 to unwind the winding body 62, the elongated metal plate 64 extending like a strip is supplied as shown in FIG. 11. After the through-holes 25 are formed in the elongated metal plate 64, the elongated metal plate 64 provides the sheet-like metal plate 21 and further the deposition mask 20.

The supplied elongated metal plate 64 is transported by the transport rollers 72 to an etching apparatus (etching means) 70. The respective processes shown in FIGS. 12 to 20 are performed by means of the etching means 70.

Figure 12:
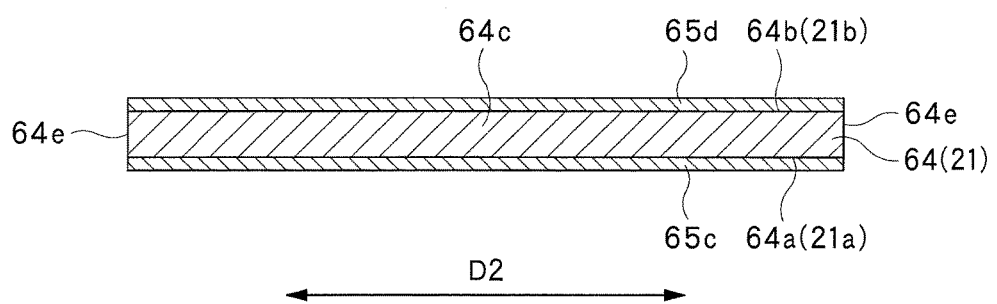
FIG. 12 is a view for explaining an example of the method of manufacturing the deposition mask, which is a sectional view showing a step of forming a resist film on the metal plate.
Figure 13:
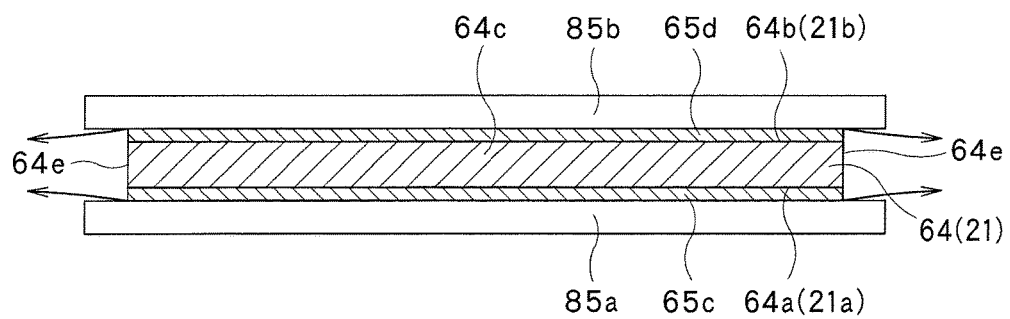
FIG. 13 is a view for explaining the example of the method of manufacturing the deposition mask, which is a sectional view showing a step of bringing an exposure mask into tight contact with the resist film.

As shown in FIG. 12, a negative-type photosensitive resist material is firstly applied to the first surface 64a (lower surface in the sheet plane of FIG. 12) and the second surface 64b of the elongated metal plate 64, so that resist films 65c and 65d are formed on the elongated metal plate 64. Then, exposure masks 85a and 85b which do not allow light to transmit through areas to be removed of the resist films 65c and 65d are prepared. As shown in FIG. 13, the masks 85a and 85d are located on the resist films 65c and 65d. For example, glass dry plates which do not allow light to transmit through the areas to be removed from the resist films 65c and 65d are used as the exposure masks 85a and 85d. Thereafter, the exposure masks 85a and 85b are sufficiently brought into tight contact with the resist films 65c and 65d by vacuum bonding.

A positive-type photosensitive resist material may be used. In this case, there is used an exposure mask which allows light to transmit through an area to be removed of the resist film.

Figure 14:
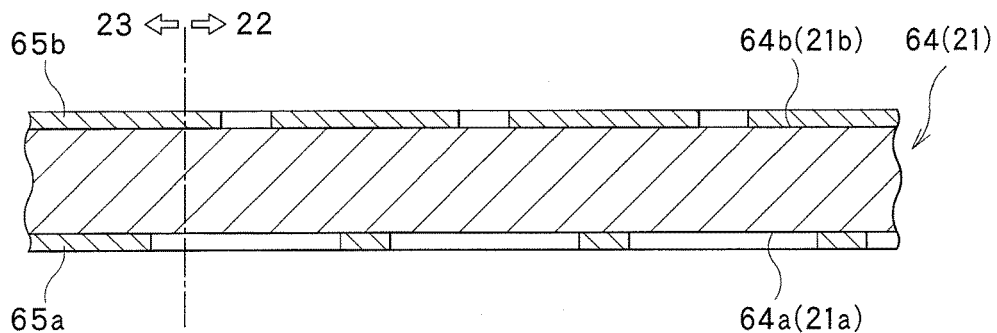
FIG. 14 is a view for explaining the example of the method of manufacturing the deposition mask, showing an elongated metal plate in a section along a normal direction.

After that, the resist films 65c and 65d are exposed through the exposure masks 85a and 85b, and the resist films 65c and 65d are further developed. Thus, as shown in FIG. 14, a resist pattern (also referred to simply as resist) 65a can be formed on the first surface 64a of the elongated metal plate 64, while a resist pattern (also referred to simply as resist) 65b can be formed on the second surface 64b of the elongated metal plate 64.

Figure 15:
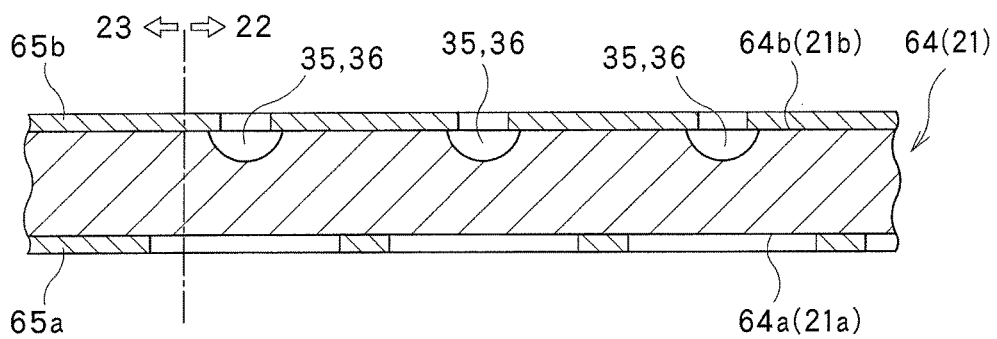
FIG. 15 is a view for explaining the example of the method of manufacturing the deposition mask, showing the elongated metal plate in a section along the normal direction.

Then, as shown in FIG. 15, by using an etching liquid (e.g., ferric chloride solution), the elongated metal plate 64 is etched from the side of the second surface 64b, with the resist pattern 65d formed on the elongated metal plate 64 serving as a mask. For example, the etching liquid is ejected from a nozzle, which is disposed on the side facing the second surface 64b of the transported elongated metal plate 64, toward the second surface 64b of the elongated metal plate 64 through the resist pattern 65b. As a result, as shown in FIG. 15, areas of the elongated metal plate 64, which are not covered with the resist pattern 65b, are eroded by the etching liquid. Thus, a lot of second recesses 35 are formed in the elongated metal plate 64 from the side of the second surface 64b.

Figure 16:
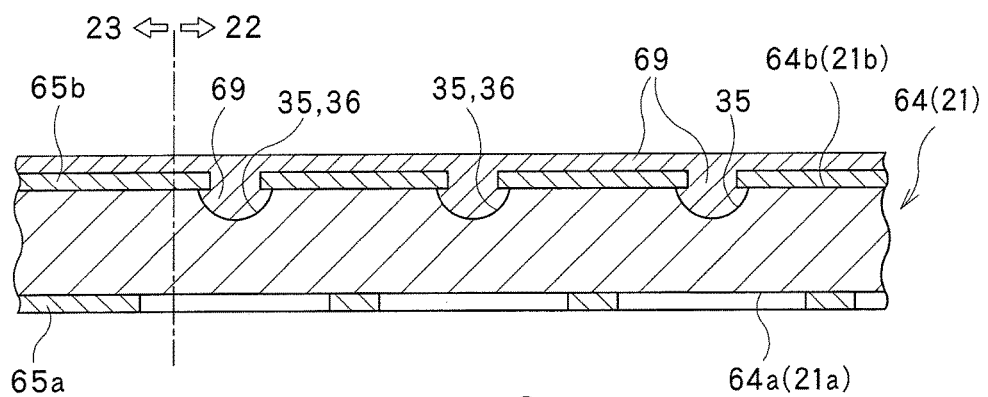
FIG. 16 is a view for explaining the example of the method of manufacturing the deposition mask, showing the elongated metal plate in a section along the normal direction.

After that, as shown in FIG. 16, the formed second recesses 35 are coated with a resin 69 resistant to the etching liquid. Namely, the second recesses 35 are sealed by the resin 69 resistant to the etching liquid. In the example shown in FIG. 16, a film of the resin 69 is formed to cover not only the formed second recesses 35 but also the second surface 64b (resist pattern 65b).

Figure 17:
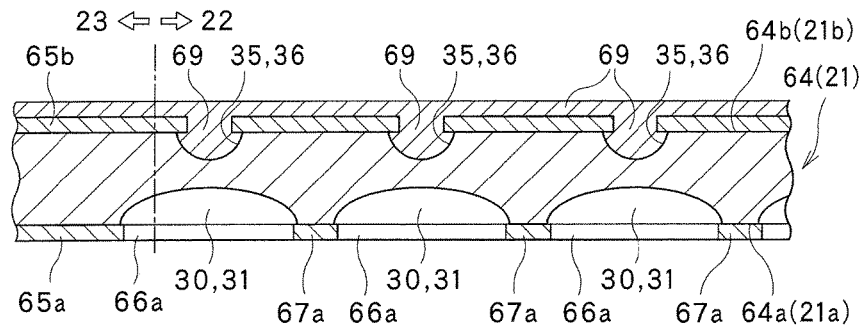
FIG. 17 is a view for explaining the example of the method of manufacturing the deposition mask, showing the elongated metal plate in a section along the normal direction.

Then, as shown in FIG. 17, the elongated metal plate 64 is subjected to the second etching process. In the second etching process, the elongated metal plate 64 is etched only from the side of the first surface 64a, so that the first recess 30 is gradually formed from the side of the first surface 64a. This is because the elongated metal plate 64 is coated with the resin 69 resistant to the etching liquid, on the side of the second surface 64b. Thus, there is no possibility that the second recesses 35, which have been formed to have a desired shape by the first etching process, are impaired.

Figure 18:
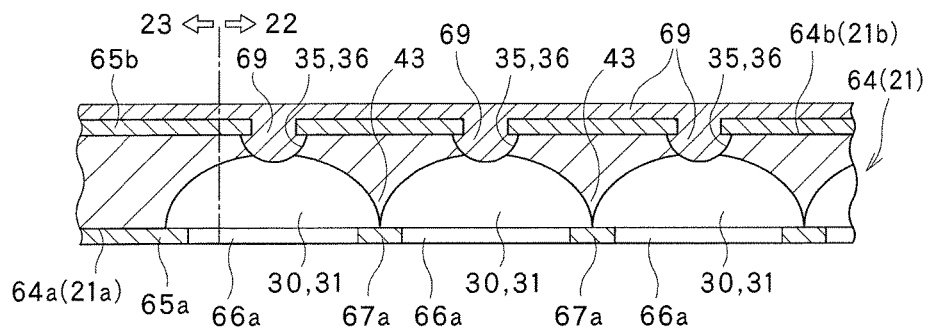
FIG. 18 is a view for explaining the example of the method of manufacturing the deposition mask, showing the elongated metal plate in a section along the normal direction.

The erosion by the etching process takes place in an area of the elongated metal plate 64, which is in contact with the etching liquid. Thus, the erosion develops not only in the normal direction (thickness direction) of the elongated metal plate 64 but also in a direction along the plate plane of the elongated metal plate 64. Thus, as shown in FIG. 18, with the development of etching in the normal direction of the elongated metal plate 64, not only the first recess 30 becomes continuous with the second recess 35, but also two first recesses 30, which are formed at positions facing two adjacent holes 66a of the resist pattern 65a, are merged with each other on a reverse side of a bridge portion 67a positioned between the two holes 66a.

Figure 19:
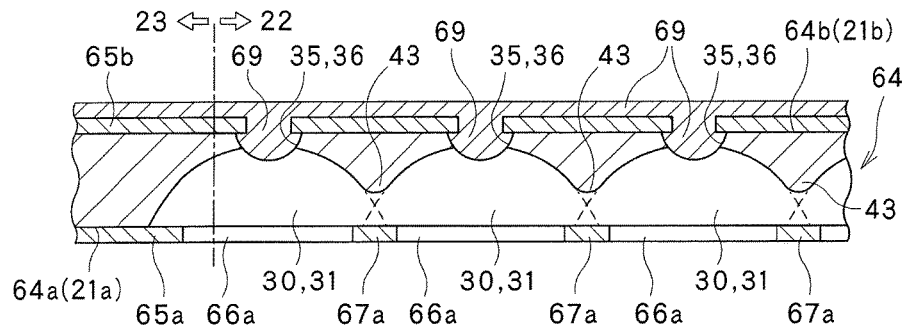
FIG. 19 is a view for explaining the example of the method of manufacturing the deposition mask, showing the elongated metal plate in a section along the normal direction.

As shown in FIG. 19, the etching from the side of the first surface 64a of the elongated metal plate 64 further develops. As shown in FIG. 19, a merged portion 43 where the two adjacent first recesses 30 are merged with each other is separated from the resist pattern 65a, and the erosion by the etching process develops also in the normal direction (thickness direction) of the metal plate 64 at the merged portion 43 below the resist pattern 65a. Thus, the merged portion 43, which is sharpened toward the one side along the normal direction of the deposition mask, is etched from the one side along the normal direction of the deposition mask, so that the merged portion 43 is chamfered as shown in FIG. 19. Thus, the inclination angle $\theta 1$, which is defined by the wall surface 31 of the first recess 30 with respect to the normal direction of the deposition mask, can be increased.

In this manner, the erosion of the first surface 64a of the elongated metal plate 64 by the etching process develops in the whole area forming the effective area 22 of the elongated metal plate 64. Thus, a maximum thickness Ta along the normal direction of the elongated metal plate 64, in the area forming the effective area 22, becomes smaller than a maximum thickness Tb of the elongated metal plate 64 before being etched.

When the etching process from the side of the first surface 64a of the elongated metal plate 64 develops by a preset amount, the second etching process to the elongated metal plate 64 is ended. At this time, the first recess 30 extends in the thickness direction of the elongated metal plate 64 up to a position where it reaches the second recess 35, whereby the through-hole 25 is formed in the elongated metal plate 64 by means of the first recess 30 and the second recess 35 that are in communication with each other.

Figure 20:
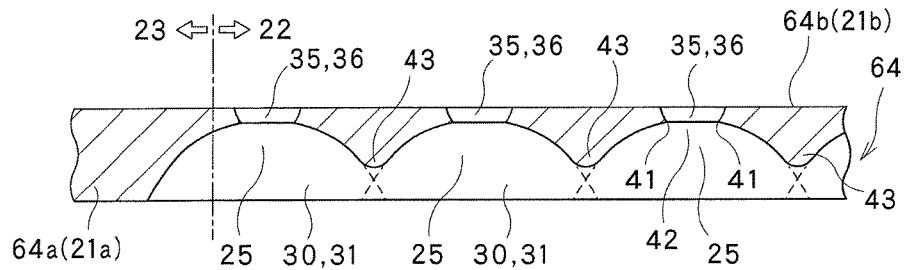
FIG. 20 is a view for explaining the example of the method of manufacturing the deposition mask, showing the elongated metal plate in a section along the normal direction.

After that, as shown in FIG. 20, the resin 69 is removed from the elongated metal plate 64. For example, the resin 69 can be removed by using an alkali-based peeling liquid. When the alkali-based peeling liquid is used, as shown in FIG. 20, the resist patterns 65a and 65b are removed simultaneously with the removal of the resin 69. However, after the removal of the resin 69, the resist patterns 65a and 65b may be removed separately from the resin 69.

The elongated metal plate 64 having a lot of through-holes 25 formed therein is transported to a cutting apparatus (cutting means) 73 by the transport rollers 72, 72 which are rotated while sandwiching therebetween the elongated metal plate 64. The above-described supply core 61 is rotated through a tension (tensile stress) that is applied by the rotation of the transport rollers 72, 72 to the elongated metal plate 64, so that the elongated metal plate 64 is supplied from the winding body 62.

Thereafter, the elongated metal plate 64 in which a lot of recesses 30, 35 are formed is cut by the cutting apparatus (cutting means) 73 to have a predetermined length and a predetermined width, whereby the sheet-like metal plate 21 having a lot of through-holes 25 can be obtained.

In this manner, the deposition mask 20 formed of the metal plate 21 having a lot of through-holes 25 can be obtained. According to this embodiment, the first surface 21a of the metal plate 21 is etched over the whole effective area 22. Thus, the thickness of the effective area 22 of the deposition mask 20 can be reduced, and the outline of the portion 43, where the distal edges 32 of the wall surfaces 31 of the two first recesses 30 formed on the side of the first surface 21a are merged with each other, can have a chamfered shape. As a result, the aforementioned angle θ1 can be increased, to thereby improve the utilization efficiency of the deposition material and the positional precision of deposition.

As described above, the thickness of the elongated metal plate 64 prepared for making the deposition masks 20 is as small as about 0.020 to 0.100 mm, for example. When the significantly thin elongated metal plate 64 is transported, the buckling bend, in which the elongated metal plate 64 bends along its longitudinal direction when a tensile stress is applied to the elongated metal plate 64, tends to occur. In addition, in the effective area 22, areas where the through-holes 25 are not formed are etched. Thus, the elongated metal plate 64, which is transported in a roll-to-roll fashion in the manufacturing step of the deposition mask 20, is thin in the first place, and becomes locally thinner after the etching step. Thus, after the etching step, the buckling bend is more likely to occur. The present inventors have conducted extensive studies and found that the buckling bend tends to occur when the elongated metal plate 64 has a large middle wave. Various reasons can be considered about the correlation between the middle wave and the buckling bend.

For example, the fact that there is a large middle wave means that a portion to which a tensile stress for transport is not sufficiently applied (hereinafter also referred to as "loose portion") is likely to present in the central area R1 in the width direction of the elongated metal plate 64. When such a loose portion exists, since the tensile stress applied to the elongated metal plate 64 becomes non-uniform around the loose portion, deformation along the transport direction may tend to occur. In particular, the loose portion existing in the central area R1 has greater impact on the non-uniformity of the tensile stress. Thus, it can be considered that, since a roller or the like for converting the transport direction of the elongated metal plate cannot apply pressure to the loose portion, the loose portion floats up from the roller. Further, not only the loose portion floats up, but also the elongated metal plate may undergo the buckling bend. Since the elongated metal plate having underwent the buckling bend is discarded as a reject product, the fact that the buckling bend tends to occur involves lowering of the throughput of the deposition masks 20.

According to this embodiment, in line with the above condition (1), the elongated metal plate 64, in which the maximum value $K1_{max}$ of the steepness degree at the central area R1 in the width direction D2 of the elongated metal plate 64 is not more than 0.4%, is used. Namely, a looseness degree in the central area R1 is small. Thus, deformation such as the buckling bend can be restrained. Thus, the deposition masks 20 can be manufactured at a high throughput.

In addition, when a tensile stress applied to the elongated metal plate 64 largely differs depending on a position in the width direction of the elongated metal plate 64, a so-called slippage, in which a transport direction of the elongated metal plate 64 displaces from an ideal transport direction, i.e., a direction perpendicular to the axial direction of the transport rollers 72, tends to occur. For example, when a tensile stress applied to the one end side area R2 of the elongated metal plate 64 is significantly larger than a tensile stress applied to the central area R1 or the other end side area R3 of the elongated metal plate 64, the transport direction of the elongated metal plate 64 is displaced toward the one end side of the elongated metal plate 64. When the transport direction of the elongated metal plate 64 is further displaced, the elongated metal plate 64 may move outside the transfer area and cannot be transported any more. Thus, the fact that the slippage tends to occur involves lowering of the utilization efficiency and the throughput of the deposition masks 20.

The apparatus performing the transport in a roll-to-roll fashion is generally equipped with control means that monitors a position of an object being transported in the width direction, and corrects the transport direction based on the monitoring result such that the transport direction of the object is not largely displaced from the ideal one. However, when the transport direction of the object is displaced before a response of the control means, the object may be detached from the transport roller before the transport direction correction is completed. Thus, it is important that a tensile force applied to the object does not locally become large, without relying only on the control means.

According to this embodiment, in line with the above condition (2), the elongated metal plate 64, in which the maximum value $K1_{max}$ of the steepness degree at the central area R1 in the width direction D2 of the elongated metal plate 64 is not more than the maximum value $K2_{max}$ at one end side area R2 in the width direction D2 of the elongated metal plate 64, and is not more than the maximum value $K3_{max}$ at the other end side area R3 in the width direction D2 of the elongated metal plate 64, is used. Thus, the tensile stress applied to the central area R1 can be generally increased as compared with the tensile stress applied to the one end side area R2 and the tensile stress applied to the other end side area R3. Namely, a tensile force applied along the ideal transport direction can be sufficiently ensured.

In addition, according to this embodiment, in line with the above condition (3), the elongated metal plate 64, in which the difference between the maximum value $K2_{max}$ of the steepness degree at the one end side area R2 and the maximum value $K3_{max}$ of the steepness degree at the other end side area R3 is not more than 0.4%, is used. Thus, it can be prevented that one of the tensile stress applied to the one end side area R2 and the tensile stress applied to the other end side area R3 is significantly larger than the other.

Owing to these conditions, according to this embodiment, occurrence of the slippage of the elongated metal plate 64 can be restrained in the manufacturing step of the deposition mask 20. Thus, the quality of the deposition mask 20 can be ensured, and the production efficiency and the throughput of the deposition masks 20 can be improved.

(Deposition Method)

Next, a method of depositing the deposition material onto the substrate 92 by use of the obtained deposition mask 20 is described. As shown in FIG. 2, the deposition mask 20 is firstly brought into tight contact with the substrate 92. At this time, the deposition mask 20 is mounted on the frame 15 in a taut condition, so that the surface of the deposition mask 20 is in parallel with the surface of the substrate 92. According to this embodiment, there is used the elongated metal plate 64 that is selected beforehand based on the steepness degree in the width direction D2. Thus, as compared with a case in which such selection is not carried out, the dispersion of steepness degrees in each deposition mask 20, and thus the dispersion of pitches of the through-holes 25 in the effective area 22 are uniformly decreased. Thus, the deposition material can be deposited onto the substrate 92 at a high positional precision. Therefore, when pixels of an organic EL display device are formed by deposition, the dimensional precision and the positional precision of the pixels in the organic EL display device can be improved. As a result, an organic EL display device of high definitions can be manufactured.

In addition, in this embodiment, there is explained the example in which the first surface 21a of the metal plate 21 is etched over the whole effective area 22. However, not limited thereto, the first surface 21a of the metal plate 21 may be etched over only a part of the effective area 22.

In addition, in this embodiment, there is explained the example in which a mask having a plurality of through-holes 25 formed therein, which is manufactured from the elongated metal plate 64, is the deposition mask 20 used for the deposition in a desired pattern. However, the mask manufactured from the elongated metal plate 64 is not limited to the deposition mask 20. For example, another mask such as a shadow mask can be manufactured with the use of the elongated metal plate 64.

EXAMPLES

Next, although the present invention is described in more detail referring to examples, the present invention is not limited to the below examples as long as it departs from the scope of the present invention.

(First Winding Body and First Sample)

Firstly, by performing the aforementioned rolling step, the slitting step, the annealing step and the cutting step were performed to the base metal made of the invar alloy, a winding body (first winding body) around which an elongated metal plate was wound was manufactured.

To be specific, a first rolling step, in which a first hot rolling step and a first cold rolling step were performed in this order, was firstly performed. Then, a first slitting step, in which both ends in the width direction of the elongated metal plate were slit over a range of 3 mm to 5 mm, respectively, was performed. Thereafter, a first annealing step, in which the elongated metal plate was continuously annealed at 500° C. for 60 seconds, was performed. Further, a second rolling step including a second cold rolling step was performed to the elongated metal plate having underwent the first annealing step. Then, a second slitting step, in which both ends in the width direction of the elongated metal plate were slit over a range of 3 to 5 mm, respectively, was performed. Thereafter, a second annealing step, in which the elongated metal plate was continuously annealed at 500° C. for 60 seconds, was performed. Thus, the elongated metal plate 64 of about 600 mm in width, which has a desired thickness, was obtained. After that, a cutting step, in which both ends in the width direction of the elongated metal plate 64 were cut over a predetermined range, respectively, was performed such that the width of the elongated metal plate 64 was finally adjusted to a desired width, specifically, 500-mm width.

In the above cold rolling step, a pressure adjustment with a backup roller was performed. Specifically, the shape and the pressure of the backup roller of a rolling machine were adjusted such that the elongated metal plate 64 was bilaterally symmetric in shape. In addition, the cold rolling step was performed while being cooled with rolling oil such as coal oil. After the cold rolling step, a cleaning step, in which the elongated metal plate was cleaned with a hydrocarbon cleaning agent, was performed. After the cleaning step, the slitting step was performed.

After that, by cutting a distal end of the first winding body by means of a shearing cutter, a first sample 100 made of a metal plate having a width of 500 mm and a projection length of 700 mm was obtained. The "projection length" means a length of the metal plate (dimension in the rolling direction) when viewed from directly above, i.e., when a corrugation of the metal plate is discounted. The width of the first sample 100 means a distance between a pair of ends 101 and 102 of the first sample 100 in the width direction. The pair of ends 101 and 102 of the first sample 100 are ends that have been formed by the cutting step in which the both ends in the width direction of the metal plate obtained by the rolling step and the annealing step, and extend substantially linearly.

Figure 21:
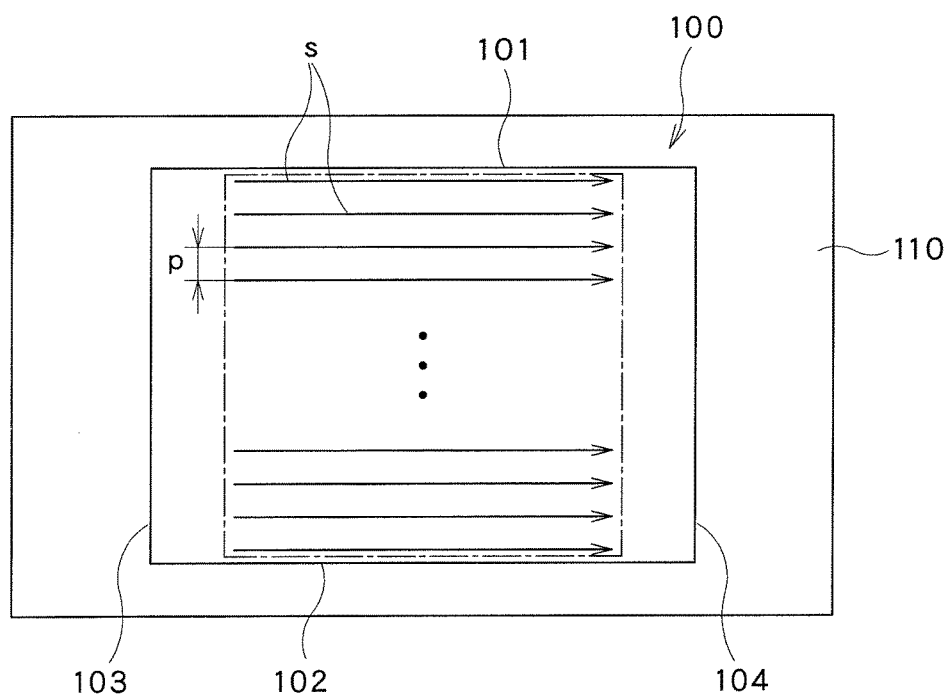
FIG. 21 is a plan view showing a first sample placed on a surface plate.

Then, as shown in FIG. 21, the first sample 100 was horizontally placed on a surface plate 110. At this time, the first sample 100 was gently placed on the surface plate 110 such that the first sample 100 was not partially recessed. Then, a steepness degree of the first sample 100 was measured at one end 101 of the first sample 100 in an area of the projection length of 500 mm. The area of the projection length of 500 mm means an area other than areas that are within 100 mm from both ends 103 and 104. The reason of omitting the areas within 100 mm from the both ends 103 and 104 is to prevent that distortion of the first sample 100, which was caused by the cutting process by the shearing cutter, had an effect on a measurement result of the steepness degree. In FIG. 21, the area of the projection length of 500 mm is shown by the one-dot chain lines.

In the measurement, as shown by the arrow s in FIG. 21, by moving a distance measuring apparatus using a laser beam relatively to the first sample 100 along the longitudinal direction of the first sample 100, a height position of the surface at the one end 101 of the first sample 100 in the longitudinal direction was continuously measured, and a profile of the elongated metal plate 64 was drawn with a smooth curved line. After that, cycles and heights of a plurality of peaks included in the curved line were respectively calculated based on the obtained curved line. Then, a steepness degree of each peak was calculated, and an average value of the steepness degrees of the peaks was calculated. In this manner, the steepness degree of the first sample 100 at the one end 101 was calculated.

OPTELICS H1200, which is a laser microscope manufactured by Lasertec Corporation, was used as the distance measuring apparatus for measuring a height position of the surface of the first sample 100. An element to be moved during the measurement may be either the distance measuring apparatus or the first sample 100. Herein, an automatic measurement was performed by using the surface plate 110 serving as a stage, and a machine for moving a head formed of OPTELICS H1200 in an XY direction. The stage was an automatic stage of 500 mm×500 mm. A laser interferometer was utilized to control the automatic stage in the XY direction.

Then, at a position displaced by 2 mm from the one end 101 to the other end 102, the steepness degree of the sample 100 was similarly measured. By repeating the above measurement at different positions of predetermined pitches in the width direction of the first sample 100, the steepness degree of the first sample at each position in the width direction was measured. Herein, the pitch p was 2 mm. The obtained measurement result includes the measurement result of the steepness degree at the aforementioned one end side area R2 including the one end 101, the measurement result of the steepness degree at the aforementioned other end side area R3 including the other end 102, and the measurement result of the steepness degree at the aforementioned central area R1 including the central position. The central area R1 is an area in which a distance from the one end 101, which is a reference position, is within 150 mm to 350 mm. The one end side area R2 is an area in which a distance from the one end 101, which is the reference position, is within 0 to 150 mm. The other end side area R3 is an area in which a distance from the one end 101, which is the reference position, is within 350 mm to 500 mm.

The measurement showed that a maximum value $K1_{max}$ of the steepness degree in the central area R1 was 0.2%, that a maximum value $K2_{max}$ of the steepness degree in the one end side area R2 was 0.1%, and a the maximum value $K3_{max}$ of the steepness degree in the other end side area R3 was 0.3%. By comparing these measurement results and the above conditions (1) to (3) with each other, it was found that the first sample 100 satisfied the conditions (1) and (3) but did not satisfy the condition (2). Thus, it was judged that the first sample 100 could not be used for manufacturing a deposition mask.

(Evaluation of Primary Effect, Part 1)

Figure 22:
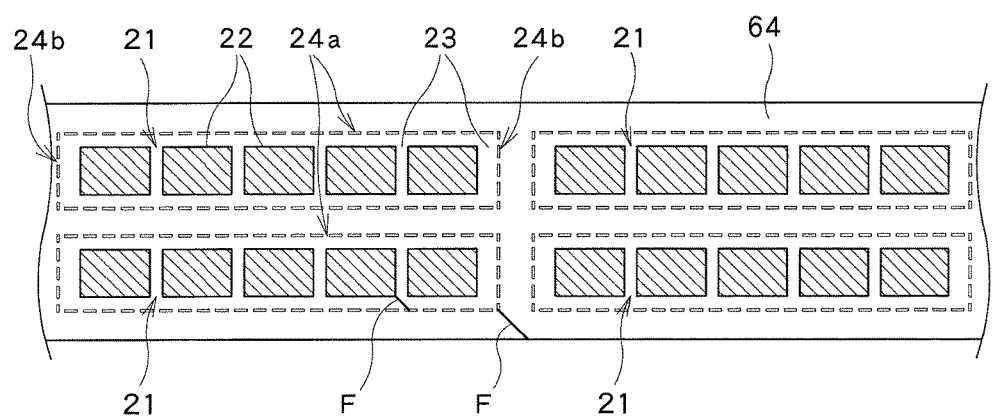
FIG. 22 is a plan view showing an elongated metal plate in a first embodiment obtained from a first winding body.

Deposition masks 20 were manufactured from the elongated metal plate 64 of the first winding body by using the above manufacturing method of a deposition mask. FIG. 22 is a view showing the elongated metal plate 64 to which a plurality of metal plates 21 for constituting deposition masks 20 according to this evaluation are assigned.

In FIG. 22, a pair of first rupture lines partitioning the respective metal plates 21 in the longitudinal direction of the elongated metal plate 64 are indicated by the symbol 24a, and a pair of second rupture lines partitioning the respective metal plates 21 in the width direction of the elongated metal plate 64 are indicated by the symbol 24b. In this case, by cutting the elongated metal plate 64 along the first rupture line 24a and the second rupture line 24b, deposition masks 20 formed of the sheet-like metal plates 21 can be obtained. In the example shown in FIG. 22, the first rupture line 24 and the second rupture line 24b are perforated lines. The perforated lines are formed simultaneously with formation of the through-holes 25, i.e., the perforated lines are formed in the etching step for forming the through-holes 25 in the effective area 22. In this case, an operator can manually rupture the first rupture line 24a and the second broke lines 24b so as to take the metal plates 21 out of the elongated metal plate 64.

In this evaluation, the first surface 64a of the elongated metal plate 64 is etched only at areas where the through-holes 25 are formed, and is not etched at the rest area.

The elongated metal plate 64 shown in FIG. 22 is also referred to as "elongated metal plate 64 in the first embodiment" herebelow.

In this evaluation, it was evaluated whether the aforementioned "slippage" and the "buckling bend" had took place or not, in the manufacturing step of the deposition mask 20 by use of the elongated metal plate 64. The evaluation was performed before and after the etching step, respectively. Whether the "slippage" took place or not was judged whether there was a displacement of 50 mm or more in which the position of the elongated metal plate 64 in the width direction was moved from the reference. Namely, when it was detected that the position of the elongated metal plate 64 in the width direction was displaced by 50 mm or more from the reference, it was judged that the "slippage" had took place. In addition, in this evaluation, whether the elongated metal plate 64 had an incision, i.e., the so-called "plate incision" after the etching step had took place or not was evaluated. In FIG. 22, a possible plate incision is indicated by the symbol F. As shown in FIG. 22, the plate incision F is likely to occur from the perforated lines and the etched effective area 22 as a starting point. When the plate incision takes place, pieces of the elongated metal plate 64 and a resist film or the like provided on the elongated metal plate 64 may fall down to an etching tank so that the etching tank has to be cleaned. Thus, the prevention of plate incision is preferred not only from the viewpoint of improving the throughput of the deposition masks but also from the viewpoint of maintaining the safety of the manufacturing line.

In the evaluation, it was found that, in the manufacturing step of deposition masks from the elongated metal plate 64 in the first embodiment which was obtained from the first winding body, the "buckling bend" and the "plate incision" had not took place, but that the "slippage" had took place.

(Evaluation of Primary, Effect Part 2)

Figure 23:
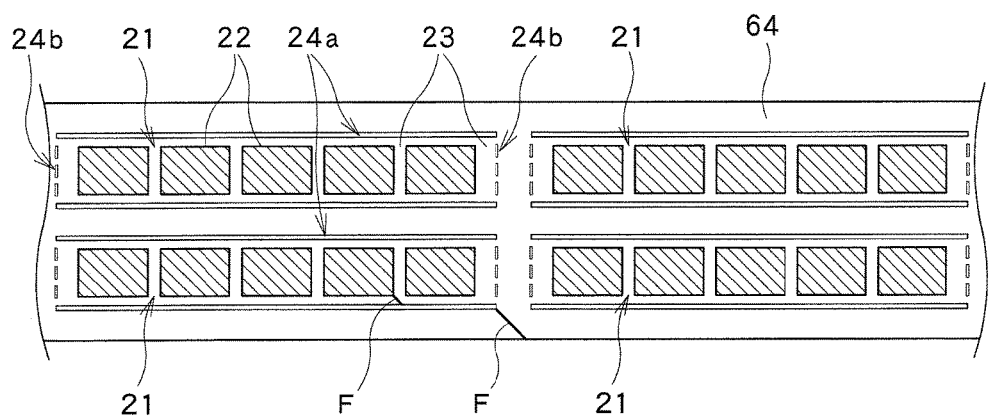
FIG. 23 is a plan view showing the elongated metal plate in a second embodiment obtained from the first winding body.

Deposition masks 20 were manufactured from the elongated metal plate 64 of the first winding body by using the above manufacturing method of a deposition mask. FIG. 23 is a view showing the elongated metal plate 64 to which a plurality of metal plates 21 for constituting deposition masks 20 according to this evaluation are assigned.

As shown in FIG. 23, in this evaluation, a pair of rupture lines 24a partitioning the respective metal plates 21 in the longitudinal direction of the elongated metal plate 64 are formed of through-holes extending along the longitudinal direction of the elongated metal plate 64. A deposition mask (metal mask for deposition) is mounted in a taut condition on a mask frame such that holes in the deposition mask are located in position with respect to a glass substrate. Thus, differently from a conventional shadow mask, only a slight deformation caused by the rupture of the rupture line in the longitudinal direction is not allowed. For this reason, as shown in FIG. 23, the first rupture lines 24a extending in the longitudinal direction are formed of through-holes. In addition, in this evaluation, the first surface 64a of the elongated metal plate 64 is etched over the whole effective area 22. With the rest matters being similar to the above "Evaluation of Primary Effect, Part 1", it was evaluated whether the "slippage", the "buckling bend" and the "plate incision" had took place or not.

The elongated metal plate 64 shown in FIG. 23 is also referred to as "elongated metal plate 64 in the second embodiment" herebelow.

In the evaluation, it was found that in the manufacturing step of deposition masks from the elongated metal plate 64 in the first embodiment which was obtained from the first winding body, the "buckling bend" had not took place, but that the "slippage" and the "plate incision" had took place.

(Second to Twentieth Winding Bodies and Second to Twentieth Samples)

Similarly to the case of the first winding body, second to twentieth winding bodies were manufactured from a base metal made of an invar alloy. Further, similarly to the case of the first winding body, as to the second winding body to the twentieth winding body, measurement of a steepness degree of a sample taken out from each winding body, and the above described evaluations of "Primary Effect, Part 1" and "Primary Effect, Part 2" related to deposition masks made of the elongated metal plate of each winding body were performed.

(Summary of Judgment Result of Samples)

FIG. 24 shows measurement results of the steepness degrees of the samples taken out from the first winding body to the twentieth winding body. As shown in FIG. 24, judgment results of the fourth, the fifth, the eighth, the ninth, the twelfth, the thirteenth, the fifteenth and the sixteenth samples were "acceptable". Namely, all the above conditions (1) to (3) were satisfied. On the other hand, judgment results of the first, the second, the third, the sixth, the seventh, the tenth, the eleventh, the fourteenth, the seventeenth, the eighteenth, the nineteenth and the twentieth samples were "unacceptable". Namely, at least one of the above conditions (1) to (3) was not satisfied.

To be specific, the above condition (1) was not satisfied in the seventeenth, the eighteenth, the nineteenth and the twentieth samples. In addition, the above condition (2) was not satisfied in the first, the second, the third, the seventh, the eleventh, the fourteenth and the seventeenth samples. In addition, the above condition (3) was not satisfied in the third, the sixth and the tenth samples.

(Summary of "Primary Effect, Part 1" about Winding Bodies)

FIG. 25 shows the result of the aforementioned "Primary Effect, Part 1" related to the manufacture of the elongated metal plates in the first embodiment from the first winding body to the twentieth winding body. As shown in FIG. 25, the judgment results of the elongated metal plates 64 in the first embodiment obtained from the fourth, the fifth, the eighth, the ninth, the twelfth, the thirteenth, the fourteenth, the fifteenth and the sixteenth winding bodies were "acceptable". Namely, none of the "slippage", the "buckling bend" and the "plate incision" took place. On the other hand, the judgment results of the elongated metal plates 64 in the first embodiment obtained from the first, the second, the third, the sixth, the seventh, the tenth, the eleventh, the seventeenth, the eighteenth, the nineteenth and the twentieth winding bodies were "unacceptable". Namely, at least one of the "slippage", the "buckling bend" and the "plate incision" took place.

The "buckling bend" took place in the elongated metal plates 64 in the first embodiment obtained from the seventeenth, the eighteenth, the nineteenth and the twentieth winding bodies. As described above, the seventeenth, the eighteenth, the nineteenth and the twentieth samples taken out from the seventeenth, the eighteenth, the nineteenth and the twentieth winding bodies did not satisfy the above condition (1). Thus, it can be said that the above condition (1) has a close relationship with the buckling bend. As shown in FIG. 25, when the buckling bend took place before the etching step, the evaluation after the etching step could not be performed.

The "slippage" took place in the elongated metal plates 64 in the first embodiment obtained from the first, the second, the third, the sixth, the seventh, the tenth, the eleventh and the seventeenth winding bodies. As described above, the first, the second, the third, the sixth, the seventh, the tenth, the eleventh and the seventeenth samples taken out from the first, the second, the third, the sixth, the seventh, the tenth, the eleventh and the seventeenth winding bodies did not satisfy at least one of the above condition (2) and the condition (3). Thus, it can be said that the above conditions (2) and (3) have a close relationship with the slippage.

As shown in FIG. 25, no "plate incision" took place in the elongated metal plates 64 in the first embodiment obtained from any winding body.

As can be understood from the comparison between FIG. 24 and FIG. 25, none of the "slippage", the "buckling bend" and the "plate incision" in the manufacturing step of the deposition masks 20 took place in the elongated metal plates 64 made of the winding bodies whose judgment results based on the above conditions (1) to (3) were "acceptable". That is to say, by using the above conditions (1) to (3), it is possible to select a winding body capable of supplying an elongated metal plate 64 that can be stably transported in the manufacturing step of the deposition mask 20. Thus, the above conditions (1) to (3) are considered to be influential judgment methods.

(Summary of "Primary Effect, Part 2" about Winding Bodies)

FIG. 26 shows the result of the aforementioned "Primary Effect, Part 2" related to the manufacture of the elongated metal plates in the second embodiment from the first winding body to the twentieth winding body. As shown in FIG. 26, the judgment results of the elongated metal plates 64 in the second embodiment obtained from the fourth, the fifth, the eighth, the ninth, the twelfth, the thirteenth, the fifteenth and the sixteenth winding bodies were "acceptable". Namely, none of the "slippage", the "buckling bend" and the "plate incision" took place. On the other hand, the judgment results of the elongated metal plates 64 in the second embodiment obtained from the first, the second, the third, the sixth, the seventh, the tenth, the eleventh, the fourteenth, the seventeenth, the eighteenth, the nineteenth and the twentieth winding bodies were "unacceptable". Namely, at least one of the "slippage", the "buckling bend" and the "plate incision" took place.

The "buckling bend" took place in the elongated metal plates 64 in the second embodiment obtained from the fourteenth, the seventeenth, the eighteenth, the nineteenth and the twentieth winding bodies. In particular, in the fourteenth winding body, the buckling bend did not take place before the etching step, but took place after the etching step. In the measurement result of the steepness degree of the fourteenth sample cut out from the fourteenth winding body, as shown in FIG. 24, both of the maximum value $K2_{max}$ of the steepness degree at one end side area R2 and the maximum value $K3_{max}$ of the steepness degree at the other end side area R3 were smaller than the maximum value $K1_{max}$ of the steepness degree at the central area R1. Namely, the above condition (2) was not satisfied.

As shown in FIGS. 24 and 25, in the winding bodies other than the fourteenth winding body, the fact that the condition (2) was not satisfied and the fact that the "slippage" took place were closely related to each other. As shown in FIG. 25, when the elongated metal plate 64 in the first embodiment was made of the fourteenth winding body, the buckling bend did not take place. Herebelow, there is examined the reason why the buckling bend took place when the elongated metal plate 64 in the second embodiment was made of the fourteenth winding body.

Except for the fourteenth winding body, the winding bodies from which the samples that did not satisfy the condition (2) are the first, the second, the third, the seventh, the eleventh and the seventeenth winding bodies. As shown in FIG. 24, in the samples obtained from these winding bodies, only one of the maximum value $K2_{max}$ of the steepness degree at one end side area R2 and the maximum value $K3_{max}$ of the steepness degree at the other end side area R3 was smaller than the maximum value $K1_{max}$ of the steepness degree at the central area R1. Thus, it can be considered that when the condition (2) is not satisfied, the "slippage" may take place depending on whether any one of the $K2_{max}$ and the $K3_{max}$ is smaller than the $K1_{max}$. In addition, in a case where both of the $K2_{max}$ and the $K3_{max}$ are smaller than the $K1_{max}$, the buckling bend did not take place in the elongated plates in the first embodiment made of these winding bodies. Thus, the buckling bend caused by the condition (2) may take place, when both of the $K2_{max}$ and the $K3_{max}$ are smaller than the $K1_{max}$ and the elongated metal plate 64 is etched over a wide area, for example, when the first rupture line 24a is formed as a through-hole and when the whole effective area 22 is etched. According to the above condition (2), the buckling bend, which may occur depending on an etching degree, can be predicted at a stage of the winding body.

The "slippage" took place in the elongated metal plates 64 in the second embodiment obtained from the first, the second, the third, the sixth, the seventh, the tenth, the eleventh and the seventeenth winding bodies. Namely, the winding bodies having underwent the slippage from which the elongated metal plates in the first embodiment were made coincided with the winding bodies having underwent the slippage from which the elongated metal plates in the second embodiment.

The "plate incision" took place in the elongated metal plates 64 in the second embodiment obtained from the first, the second, the third, the sixth, the seventh, the tenth, the eleventh and the seventeenth winding bodies. Namely, when the elongated metal plates 64 in the second embodiment were made, the winding bodies having underwent the plate incision were the same as the winding bodies having underwent the slippage. Thus, when the elongated metal plate 64 is etched over a wide area, it can be said that the above conditions (2) and (3) have a close relationship not only with the slippage but also with the plate incision.

As can be understood from the comparison between FIG. 24 and FIG. 26, the judgment results based on the above conditions (1) to (3) and the judgment results based on the "buckling bend", the "slippage" and the "plate incision" completely coincide with each other. Namely, with the use of the above conditions (1) to (3), a winding body, which may invite failure in the manufacturing step of the deposition mask 20, can be eliminated without any loss. Thus, the above conditions (1) to (3) are considered to be significantly influential judging method when the elongated metal plate 64 is etched over a wide area.

20 Deposition mask
21 Metal plate
21a First surface of metal plate
21b Second surface of metal plate
22 Effective area
23 Surrounding area
25 Through-hole
30 First recess
31 Wall surface
35 Second recess
36 Wall surface
55 Base metal
56 Rolling apparatus
67 Annealing apparatus
61 Core]
62 Winding body
64 Elongated metal plate
64a First surface of elongated metal plate
64b Second surface of elongated metal plate
64c Central position in width direction of elongated metal plate
64e End position in width direction of elongated metal plate
65a, 65b Resist pattern
80 Curved line of Steepness degree
81 Reference line
85a, 85b Exposure mask

What is claimed is:

1. A method of manufacturing a metal plate to be used for manufacturing a mask by forming a plurality of through-holes in the metal plate, the method comprising:
    a rolling step of rolling a base metal to obtain the metal plate; and
    a cutting step of cutting off one end and the other end in a width direction of the metal plate over a predetermined range in the width direction;
    wherein:
    the through-holes of the mask are formed by etching the elongated metal plate that is being transported,
    the metal plate after the cutting step has at least partially a corrugation owing to a difference in lengths of the metal plate in a longitudinal direction depending on a position in the width direction of the metal plate;
    when a percentage of a height of the corrugation with respect to a cycle in the longitudinal direction of the corrugation of the metal plate after the cutting step is referred to as steepness degree, the following three conditions (1) to (3) are satisfied:
    (1) a maximum value of the steepness degree at a central area in the width direction of the metal plate after the cutting step is not more than 0.4%;
    (2) the maximum value of the steepness degree at the central area is not more than a maximum value of the steepness degree at one end side area in the width direction of the metal plate after the cutting step, and is not more than a maximum value of the steepness degree at the other end side area in the width direction of the metal plate after the cutting step; and
    (3) a difference between the maximum value of the steepness degree at the one end side area and the maximum value of the steepness degree at the other end side area is not more than 0.4%; and the one end side area, the central area and the other end side area respectively correspond to areas occupying 30% of the width of the metal plate after the cutting step, 40% thereof and 30% thereof.

2. The method of manufacturing a metal plate according to claim 1, wherein
the mask manufactured from the metal plate is a deposition mask used for performing deposition in a desired pattern.

3. The method of manufacturing a metal plate according to claim 2, wherein
the range on the one end side and the range on the other end side of the metal plate to be cut in the cutting step are determined based on a result of an observation step of observing the corrugation of the metal plate, the observation step being performed before the cutting step.

4. The method of manufacturing a metal plate according to claim 2, further comprising an annealing step of annealing the metal plate obtained by the rolling step to remove an internal stress of the metal plate,
wherein the annealing step is performed while the rolled base metal is being pulled in the longitudinal direction.

5. The method of manufacturing a metal plate according to claim 2, wherein
the base metal includes an invar alloy.

6. The method of manufacturing a metal plate according to claim 1, wherein
the range on the one end side and the range on the other end side of the metal plate to be cut in the cutting step are determined based on a result of an observation step of observing the corrugation of the metal plate, the observation step being performed before the cutting step.

7. The method of manufacturing a metal plate according to claim 1, further comprising an annealing step of annealing the metal plate obtained by the rolling step to remove an internal stress of the metal plate,
wherein the annealing step is performed while the rolled base metal is being pulled in the longitudinal direction.

8. The method of manufacturing a metal plate according to claim 1, wherein
the base metal includes an invar alloy.

9. A metal plate to be used for manufacturing a mask by forming a plurality of through-holes in the metal plate, the metal plate comprising:
at least partially a corrugation owing to a difference in lengths of the metal plate in a longitudinal direction depending on a position in a width direction of the metal plate;
wherein:
the through-holes of the mask are formed by etching the elongated metal plate that is being transported,
when a percentage of a height of the corrugation with respect to a cycle in the longitudinal direction of the corrugation of the metal plate is referred to as steepness degree, the following three conditions (1) to (3) are satisfied:
(1) a maximum value of the steepness degree at a central area in the width direction of the metal plate is not more than 0.4%;
(2) the maximum value of the steepness degree at the central area is not more than a maximum value of the steepness degree at one end side area in the width direction of the metal plate, and is not more than a maximum value of the steepness degree at the other end side area in the width direction of the metal plate; and
(3) a difference between the maximum value of the steepness degree at the one end side area and the maximum value of the steepness degree at the other end side area is not more than 0.4%; and
the one end side area, the central area and the other end side area respectively correspond to areas occupying 30% of the width of the metal plate, 40% thereof and 30% thereof.

10. The metal plate according to claim 9, wherein
the mask manufactured from the metal plate is a deposition mask used for performing deposition in a desired pattern.

11. The metal plate according to claim 10, wherein
the metal plate includes an invar alloy.

12. The metal plate according to claim 9, wherein
the metal plate includes an invar alloy.

13. The metal plate according to claim 9, wherein the metal plate has a thickness of 0.020-0.100 mm.

14. A method of manufacturing a mask having a plurality of through-holes formed therein, comprising:
a step of preparing a metal plate, the metal plate having at least partially a corrugation owing to a difference in lengths of the metal plate in a longitudinal direction depending on a position in a width direction of the metal plate;
a resist-pattern forming step of forming a resist pattern on the metal plate; and
an etching step of etching an area of the metal plate, which is not covered with the resist pattern, to form recesses in the metal plate, the recesses being configured to define the through-holes;
wherein
when a percentage of a height of the corrugation with respect to a cycle in the longitudinal direction of the corrugation of the metal plate is referred to as steepness degree, the following three conditions (1) to (3) are satisfied:
(1) a maximum value of the steepness degree at a central area in the width direction of the metal plate is not more than 0.4%;
(2) the maximum value of the steepness degree at the central area is not more than a maximum value at one end side area in the width direction of the metal plate, and is not more than a maximum value of the steepness degree at the other end side area in the width direction of the metal plate; and
(3) a difference between the maximum value of the steepness degree at the one end side area and the maximum value of the steepness degree at the other end side area is not more than 0.4%; and
the one end side area, the central area and the other end side area respectively correspond to areas occupying 30% of the width of the metal plate, 40% thereof and 30% thereof.

15. The method of manufacturing a mask according to claim 14, wherein:
the mask is a deposition mask used for performing deposition in a desired pattern;
the deposition mask includes an effective area in which the plurality of through-holes are formed, and a surrounding area located around the effective area; and
the etching step includes a step of etching an area of the metal plate, which is not covered with the resist pattern, to form recesses in an area to be the effective area in the metal plate, the recesses being configured to define the through-holes.

16. The method of manufacturing a mask according to claim 15, wherein the resist-pattern forming step includes:

a step of forming a resist film on the metal plate;

a step of bringing an exposure mask into vacuum contact with the resist film; and a step of exposing the resist film in a predetermined pattern through the exposure mask.

17. The method of manufacturing a mask according to claim 15, the metal plate includes an invar alloy.

18. The method of manufacturing a mask according to claim 14, wherein the resist-pattern forming step includes:

a step of forming a resist film on the metal plate;

a step of bringing an exposure mask into vacuum contact with the resist film; and a step of exposing the resist film in a predetermined pattern through the exposure mask.

19. The method of manufacturing a mask according to claim 14, the metal plate includes an invar alloy.

* * * * *